(12) United States Patent
Yabe

(10) Patent No.: US 12,040,010 B2
(45) Date of Patent: Jul. 16, 2024

(54) IR DROP COMPENSATION FOR SENSING MEMORY

(71) Applicant: SanDisk Technologies LLC, Addison, TX (US)

(72) Inventor: Hiroki Yabe, Yokohama (JP)

(73) Assignee: SanDisk Technologies LLC, Austin, TX (US)

( * ) Notice: Subject to any disclaimer, the term of this patent is extended or adjusted under 35 U.S.C. 154(b) by 87 days.

(21) Appl. No.: 17/725,712

(22) Filed: Apr. 21, 2022

(65) Prior Publication Data

US 2023/0343385 A1   Oct. 26, 2023

(51) Int. Cl.
| | |
|---|---|
| G11C 16/26 | (2006.01) |
| G11C 11/408 | (2006.01) |
| G11C 11/4091 | (2006.01) |
| G11C 11/4094 | (2006.01) |
| G11C 11/4096 | (2006.01) |

(52) U.S. Cl.
CPC ...... G11C 11/4091 (2013.01); G11C 11/4085 (2013.01); G11C 11/4094 (2013.01); G11C 11/4096 (2013.01)

(58) Field of Classification Search
CPC ............ G11C 11/4091; G11C 11/4085; G11C 11/4094; G11C 11/4096
See application file for complete search history.

(56) References Cited

U.S. PATENT DOCUMENTS

| | | | |
|---|---|---|---|
| 6,304,486 B1 | 10/2001 | Yano | |
| 7,327,619 B2 | 2/2008 | Chan et al. | |
| 7,936,606 B2 | 5/2011 | Vali et al. | |
| 8,885,416 B2 | 11/2014 | Mui et al. | |
| 9,202,579 B2 | 12/2015 | Hsiung et al. | |
| 9,443,606 B2 | 9/2016 | Dutta et al. | |
| 10,726,925 B2 | 7/2020 | Lang et al. | |
| 10,910,069 B2 | 2/2021 | Lang et al. | |
| 11,074,976 B2 | 7/2021 | Rabkin et al. | |
| 2011/0188310 A1* | 8/2011 | Kim | G11C 16/04 365/185.11 |
| 2014/0211568 A1* | 7/2014 | Mui | G11C 11/5642 365/185.21 |
| 2018/0040371 A1* | 2/2018 | Kim | G11C 13/003 |
| 2020/0381478 A1* | 12/2020 | Song | H10B 63/22 |
| 2021/0065802 A1* | 3/2021 | Rabkin | G11C 29/028 |
| 2021/0391019 A1* | 12/2021 | Shin | G06F 3/0679 |

* cited by examiner

Primary Examiner — Min Huang
(74) Attorney, Agent, or Firm — Vierra Magen Marcus LLP

(57) ABSTRACT

Technology is disclosed herein for sensing memory cells while compensating for resistance along an electrical pathway between a voltage driver and a control line connected to the memory cells. A control circuit provides a voltage from the voltage driver over a first electrical pathway to a control line in a first block and a second electrical pathway to a control line in a second block. The control circuit senses first memory cells in the first block and the second memory cells in the second block while compensating for a difference in resistance of the first and second electrical pathways. In one aspect, the control circuit discharges a first sense node for a different period of time than a second sense node to compensate for the difference in resistance. Compensating for the difference in resistance compensates for a different IR drop of the electrical pathways.

18 Claims, 20 Drawing Sheets

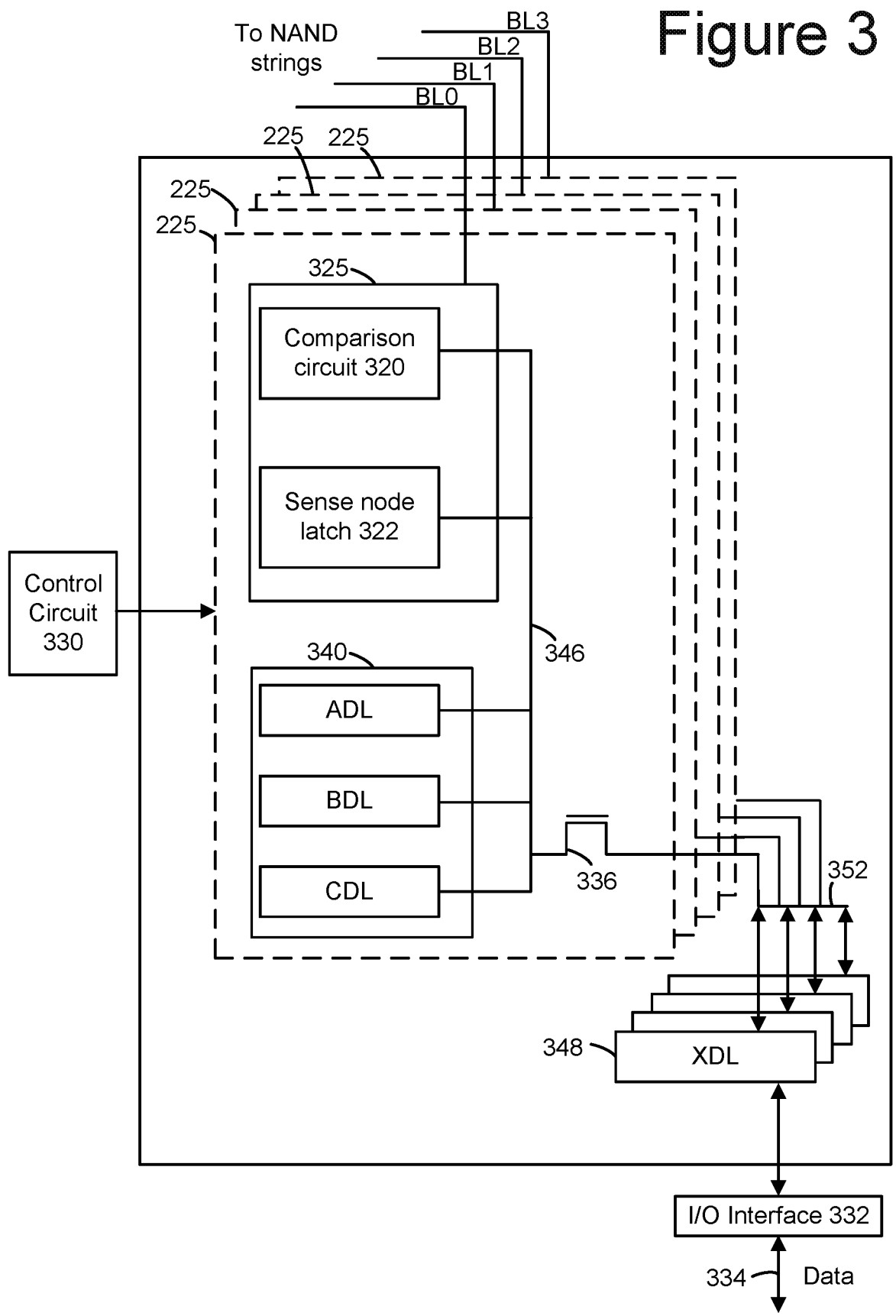

Figure 4C
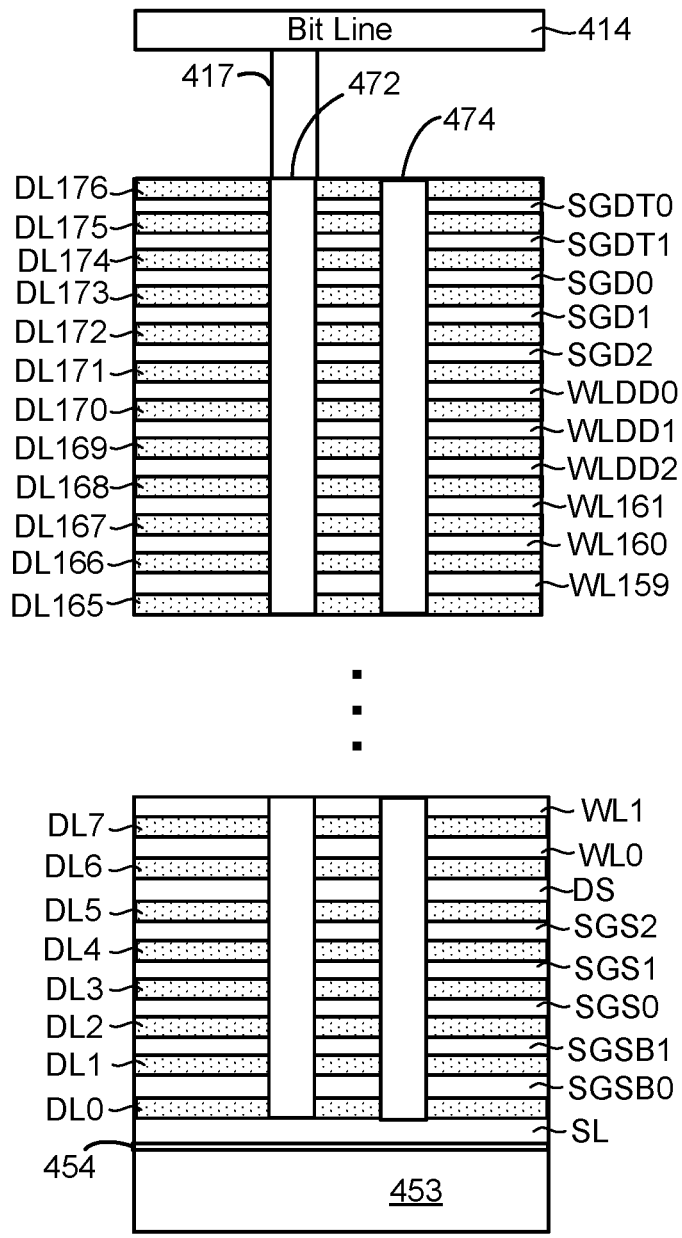
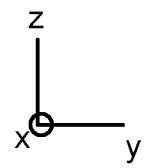

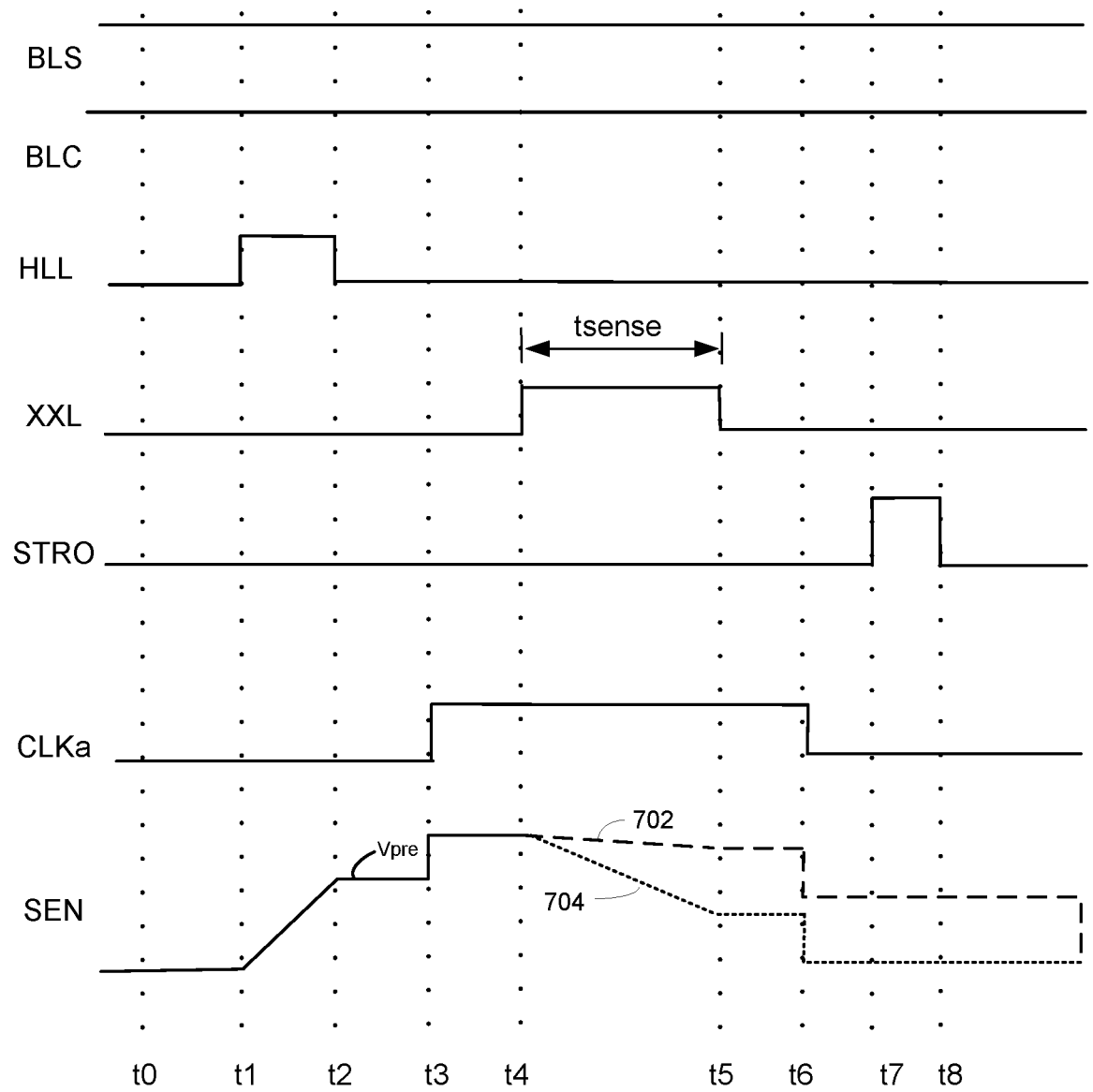

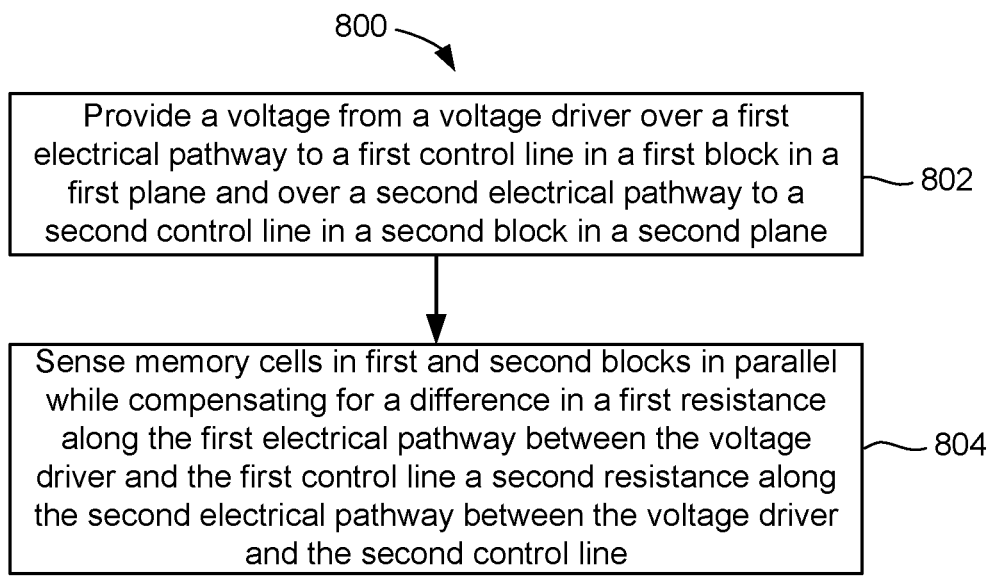
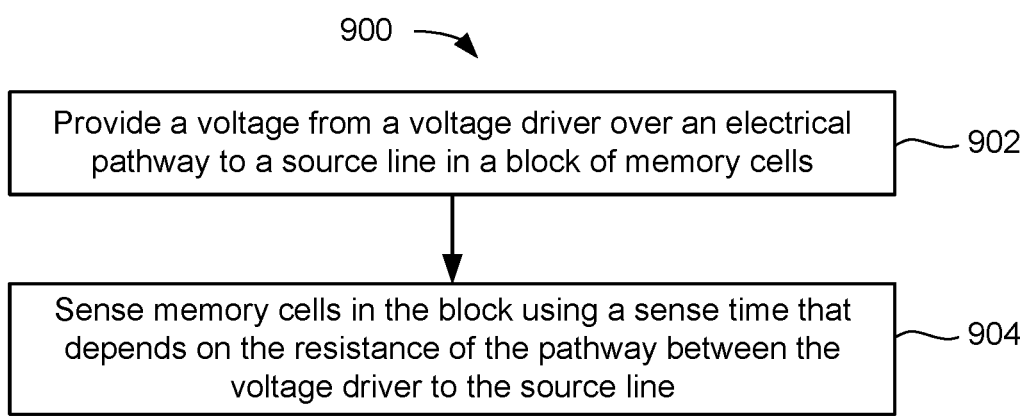

12,040,010 B2

IR DROP COMPENSATION FOR SENSING MEMORY

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be grouped into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The bit line is typically connected to a sense amplifier in order to sense a selected memory cell on the NAND string. The drain side select gate is used to connect/disconnect the channel of the NAND string to/from the bit line. The source side select gate is used to connect/disconnect the channel of the NAND string to/from a source line that is common to many NAND strings in the block. The block typically has many word lines that provide voltages to the control gates of the memory cell transistors. Typically, a word line connects to the control gates of memory cells on many NAND strings in the block. There are typically many blocks of memory cells in a plane. The different blocks in the plane may share both the bit lines and the sense amplifiers by selecting one of the blocks at time. The memory system will have voltage sources that are able to provide voltages to the various control lines such as the source lines, word lines, select lines, etc.

BRIEF DESCRIPTION OF THE DRAWINGS

Like-numbered elements refer to common components in the different figures.

FIG. 3 depicts circuitry used to sense data from non-volatile memory.

FIG. 4C depicts a portion of one embodiment of a three dimensional memory structure showing a cross-sectional view along line AA of FIG. 4B.

FIG. 7 depicts timing signals in connection with an embodiment of sensing a memory cell.

FIG. 8 is a flowchart of one embodiment of a process of sensing memory cells while compensating for IR differences.

FIG. 9 is a flowchart of one embodiment of a process 900 of sensing memory cells while compensating for IR differences between a voltage driver and source lines in different blocks.

DETAILED DESCRIPTION

Technology is disclosed herein for a memory system that senses memory cells while compensating for resistance along an electrical pathway between a voltage driver and a control line connected to the memory cells. In one embodiment, a control circuit provides a voltage from the voltage driver over an electrical pathway to a control line in a first block in a first plane and over an electrical pathway to a control line in a second block in a second plane during parallel sensing operations of a first group of memory cells in the first block and a second group of memory cells in the second block. The control circuit senses memory cells in the first group and memory cells in the second group in parallel while compensating for a difference in resistance along the electrical pathways between the voltage driver to the control line in the first block and the control line in the second block. In one embodiment, the control circuit discharges a first sense node in a first sense amplifier for a shorter period of time than a second sense node in a second sense amplifier to compensate for the difference in resistance along the electrical pathway between voltage driver to the first block and the second block. Compensating for the difference in resistance along the electrical pathway compensates for a different IR drop between the voltage driver and the control lines in the respective blocks. The different IR drop results in a different voltage at the control lines in the respective blocks.

In one embodiment, the control circuit senses memory cells while compensating for resistance along an electrical pathway from a voltage driver to a source line in a block of memory cells. The control circuit may provide a voltage from the voltage driver along the electrical pathway to a source line in a block that is selected for a sensing operation. The control circuit may sense memory cells in the selected block during the sensing operation for a length of time that depends on a resistance along the electrical pathway from the voltage driver to the source line in the selected block. In one aspect, the control circuit discharges a sense node in a sense amplifier for a length of time that depends on the resistance along the electrical pathway from the voltage driver to the source line in the selected block. The voltage at the source line can impact the current of the memory cell during the sensing operation. In one embodiment, a greater source line voltage results in a lower memory cell current. Increasing the sensing time compensates for the lower memory cell current.

Figure 1:
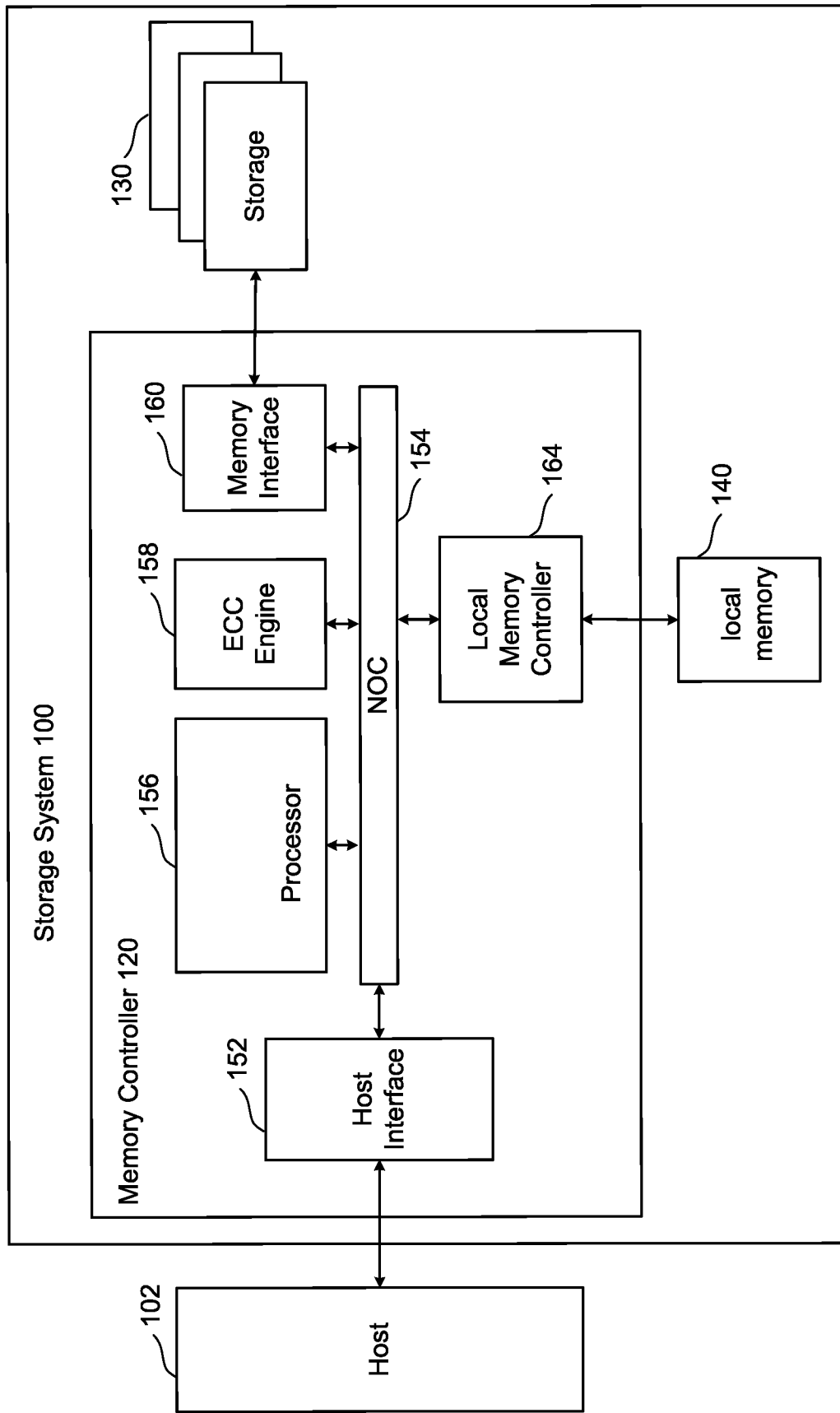
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
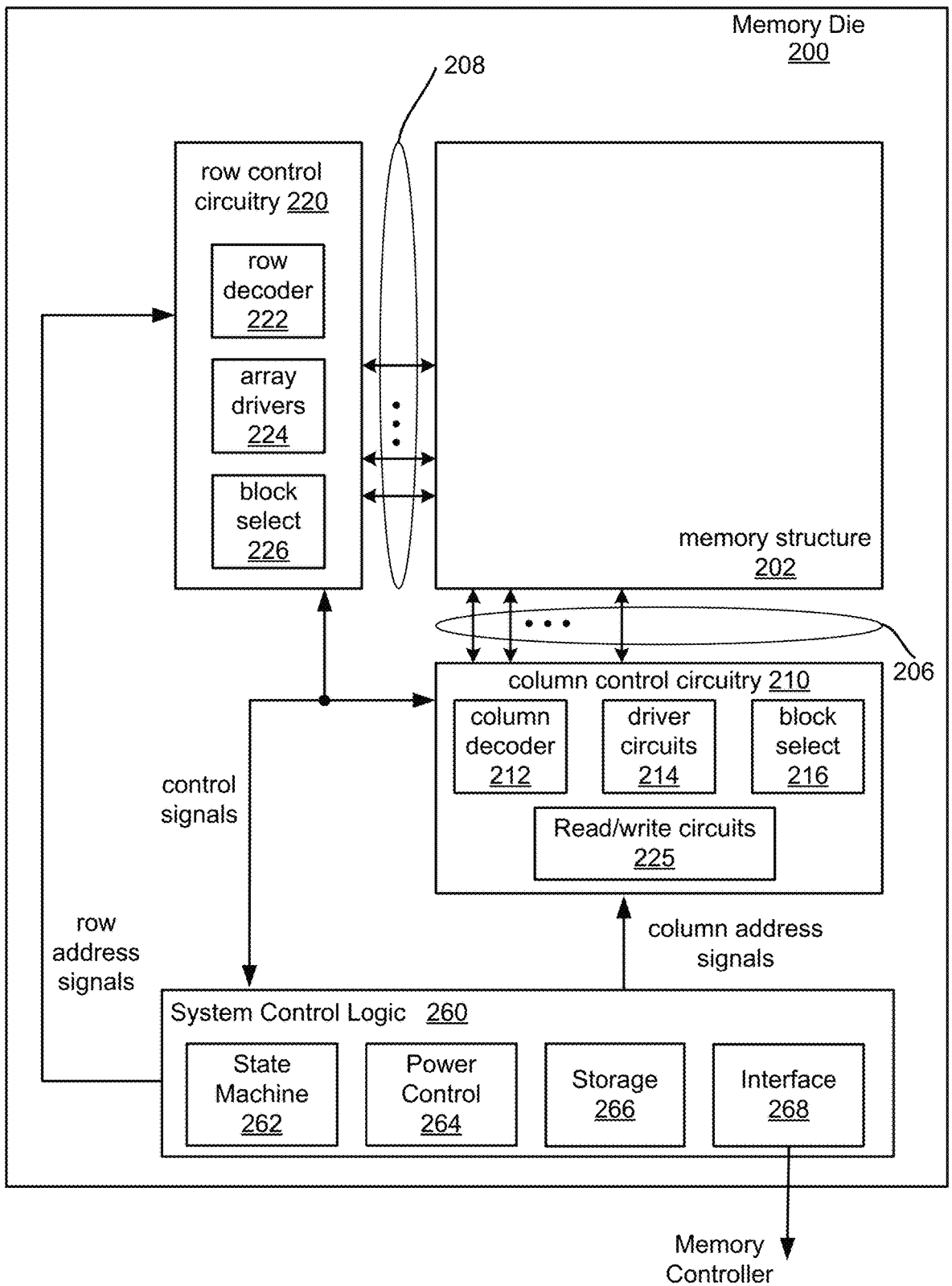
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations and may include charge pumps and regulator circuit for creating regulating voltages. Thus, power control module 264 may include a voltage driver. The voltage driver may provide an operating voltage to one or more control lines in the memory structure 202. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
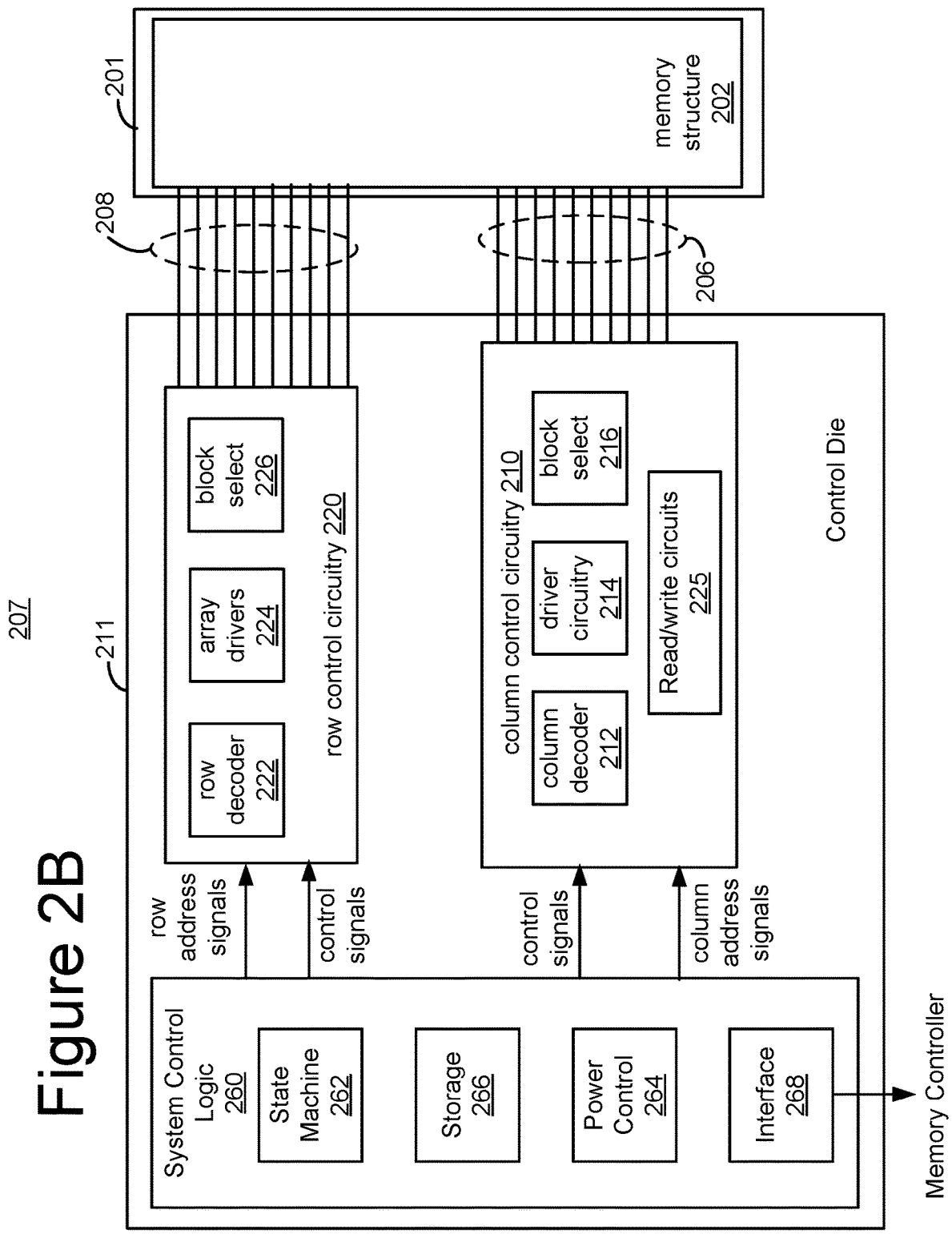
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amplifiers, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 2C:
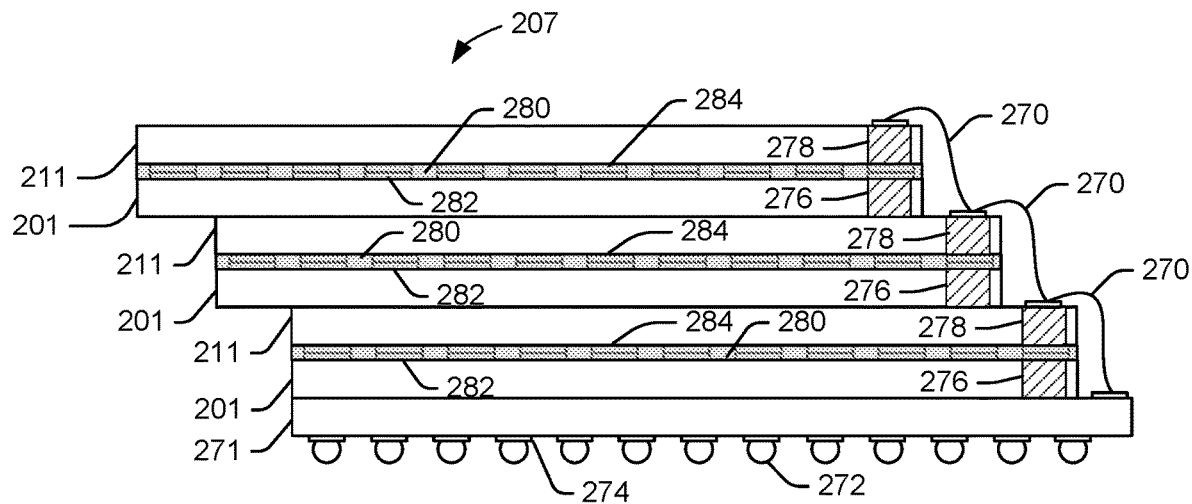
FIGS. 2C and 2D depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control die 211 and multiple memory structure die 201. FIG. 2C depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 2C there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 2C).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 2D:
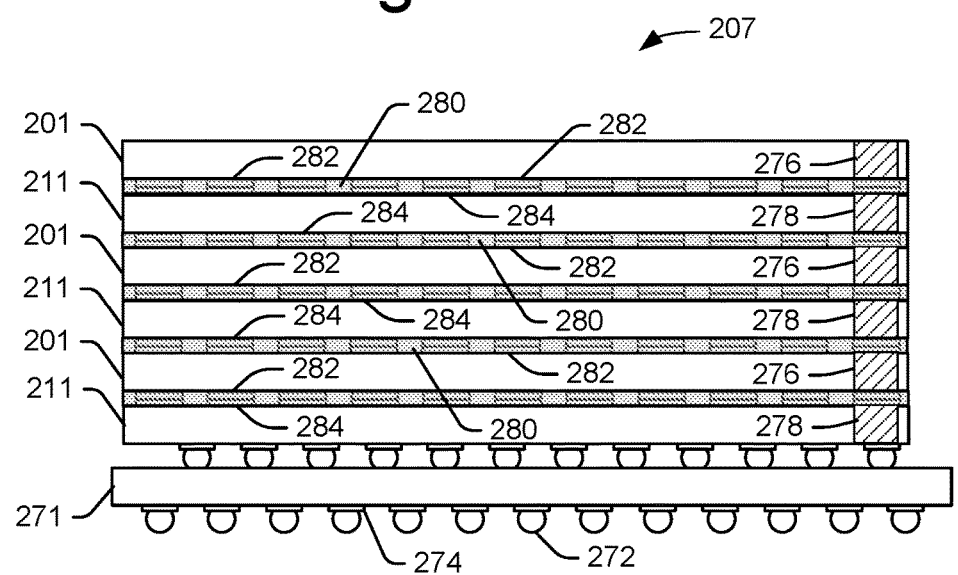

FIG. 2D depicts a side view of another embodiment of an integrated memory assembly 207 stacked on a substrate 271. The integrated memory assembly 207 of FIG. 2D has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 2C, the integrated memory assembly 207 in FIG. 2D does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm.

Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

FIG. 3 is a block diagram depicting one embodiment of a portion of column control circuitry 210 that contains a number of read/write circuits 225. Each read/write circuit 225 is partitioned into a plurality of sense amplifiers 325 and data latches 340. A control circuit 330 controls the read/write circuits 225. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time. In some embodiments, the length of the sensing time is controlled to compensate for the IR drop between a voltage driver and a control line (e.g., source line) connected to the NAND string having the memory cell being sensed.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. For example, in a program-verify test, a 0 can denote fail and a 1 can denote pass. The bit in the sense node latch can be read out in a state bit scan operation of a scan operation or flipped from 0 to 1 in a fill operation. The bit in the sense node latch 322 can also be used in a lockout scan to decide whether to set a bit line voltage to an inhibit or a program enable level in a next program loop. L The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Control circuit 330 performs computations, such as to determine the data stored in the sensed memory cell and store the determined data in the set of data latches. Each set of data latches 340 is used to store data bits determined by control circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to control circuit 330. At that point, control circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, control circuit 330 monitors the read back memory state relative to the desired memory state. When the two agree, control circuit 330 sets the bit line in a program inhibit mode such as by updating its latches. This inhibits the memory cell coupled to the bit line from further programming even if additional program pulses are applied to its control gate.

Figure 4:
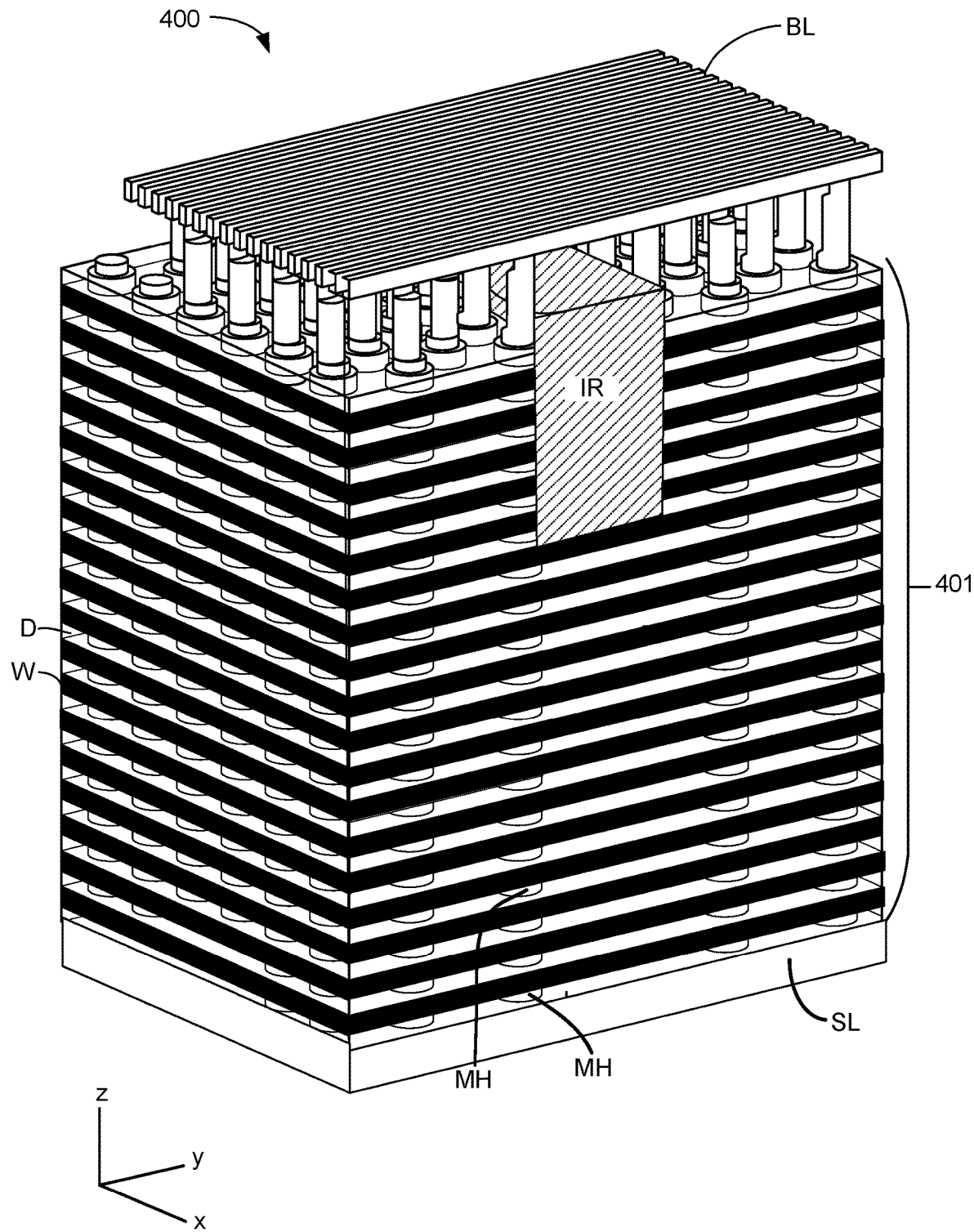
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
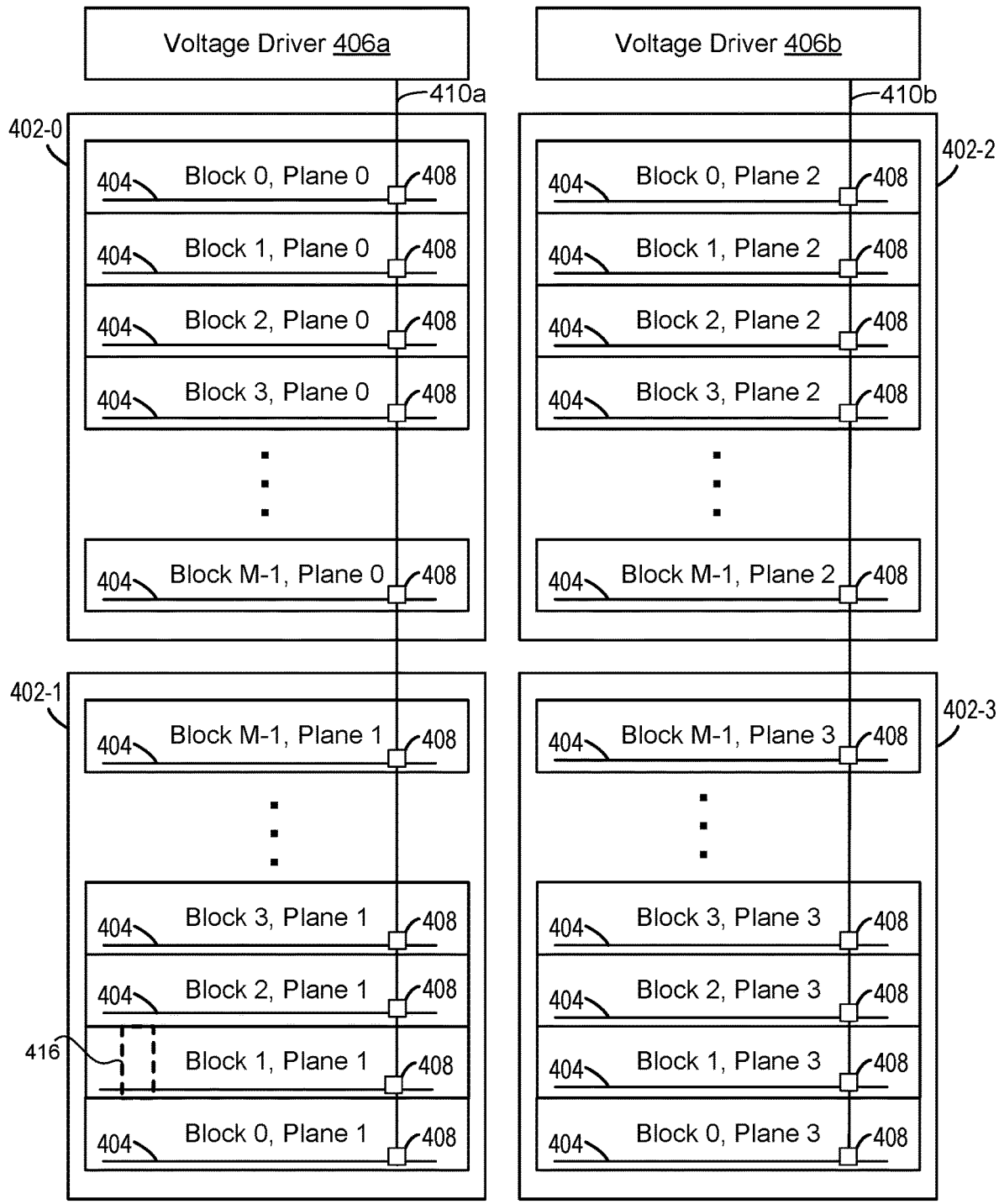
FIG. 4A is a block diagram of one embodiment of a memory structure having four planes.

FIG. 4A is a block diagram explaining one example organization of memory structure 202, which is divided into four planes 402-0, 402-1, 402-2 and 402-3. Each plane is divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. In some embodiments, the blocks in a plane are contiguous blocks in that they are next to each other or adjoined. That is, the contiguous blocks in a plane are not separated by any blocks that are not a part of the plane. Although FIG. 4A shows four planes, more or fewer than four planes can be implemented.

In some embodiments, the memory system performs memory operations in parallel on group of memory cells in each of the four planes 402-0, 402-1, 402-2, 402-3. The memory system may select a group from within one block in each of the four planes 402-0, 402-1, 402-2, 402-3. In one embodiment, the group in a given block are connected to the same word line in that block. For example, 8 KB of data may be read from each plane 402 in parallel. In one embodiment, Planes 402-0 and 402-1 form a Logical Plane, which a plane from the perspective of the host 102. Planes 402-2 and 402-3 may form another Logical Plane. Thus, in one embodiment, four 8 KB physical planes 402 appear as two 16 KB logical planes to the host 102.

Each block contains a large number of memory cells, as well as control lines 404. In one embodiment, the memory cells are arranged as NAND strings. The control lines 404 can include, but are not limited to, source lines, word lines, select lines, and/or bit lines. During operations such as read, verify, program, and erase, these control lines may be driven by a voltage driver 406. One example control line 404 is depicted in each block. As one example, the control line 404 may be a source line that connects to a source end of a large number of NAND strings in the block. FIG. 4A depicts two voltage drivers 406a, 406b. Voltage driver 406a is able to provide a voltage to the various control lines 404 in plane 402-0, 402-1 by way of an electrical pathway 410a. Voltage driver 406b is able to provide a voltage to the various control lines 404 in plane 402-2, 402-3 by way of an electrical pathway 410b. Each electrical pathway 410 contains one or more conductive lines and may contain connection elements 408 that may be controlled to provide the voltage to a specific control line 404. Each connection element 408 may contain elements such as vias, contacts, and/or transistors, which provide a connection between the control line 404 and a main electrical pathway. The main electrical pathway will include at least one conductive line that is capable of passing an electrical current. The memory system may select one block in each of plane 402-0 and 402-1, wherein the voltage driver 406a provides the voltage to the control line 404 in one block of each of plane 402-0 and 402-1. Likewise, the memory system may select one block in each of plane 402-2 and 402-3, wherein the voltage driver 406b provides the voltage to the control line 404 in one block of each of plane 402-2 and 402-3.

Significantly, there will be some resistance along the electrical pathway 410. Due to the current that flows in the electrical pathway 410 there will be some IR voltage drop along the electrical pathway 410. The IR voltage drop between the voltage driver 406a to a selected block in plane 402-0 will be different than the IR voltage drop between the voltage driver 406a to a selected block in plane 402-1. In some cases the current will flow in the direction from the respective blocks to the voltage driver 406, in which case the blocks further from the voltage driver 406 will see a higher voltage. In other cases the current will flow in the direction from the voltage driver 406 to the respective blocks, in which case the blocks further from the voltage driver 406 will see a lower voltage.

Technology is disclosed herein for a memory system that senses memory cells while compensating for resistance along an electrical pathway 410 between a voltage driver 406 and a control line 404 connected to the memory cells. In one embodiment, a control circuit provides a voltage from the voltage driver 406 over the electrical pathway 410a to a control line 404 in a first block in a first plane (e.g., Block 2, Plane 0) and over the electrical pathway 410 to a control line 404 in a second block in a second plane (e.g., Block 2, Plane 1) during parallel sensing operations of a first group of memory cells in the first block and a second group of memory cells in the second block. The portion of the electrical pathway 410a between the voltage driver 406 to the control line 404 in the first block may be referred to herein as a first electrical pathway. The portion of the electrical pathway 410a between the voltage driver 406 to the control line 404 in the second block may be referred to herein as a second electrical pathway. The second electrical pathway and the first electrical pathway may overlap. For example, the second electrical pathway may contain the first electrical pathway.

The control circuit senses memory cells in the first group and memory cells in the second group in parallel while compensating for a difference in resistance along the electrical pathway 410a between the voltage driver 406a to the control line 404 in the first block and the control line 404 in the second block. In one embodiment, the control circuit discharges a first sense node in a first sense amplifier for a shorter period of time than a second sense node in a second sense amplifier to compensate for the difference in resistance along the electrical pathway between voltage driver 406 to the first block and the second block. In one embodiment, the voltage driver 406 and the control circuit reside on a control die 211, but the planes 402 reside on a memory structure die 201. In one embodiment, the voltage driver 406 the control circuit, and the planes 402 reside on the same semiconductor die 200.

Figure 4B:
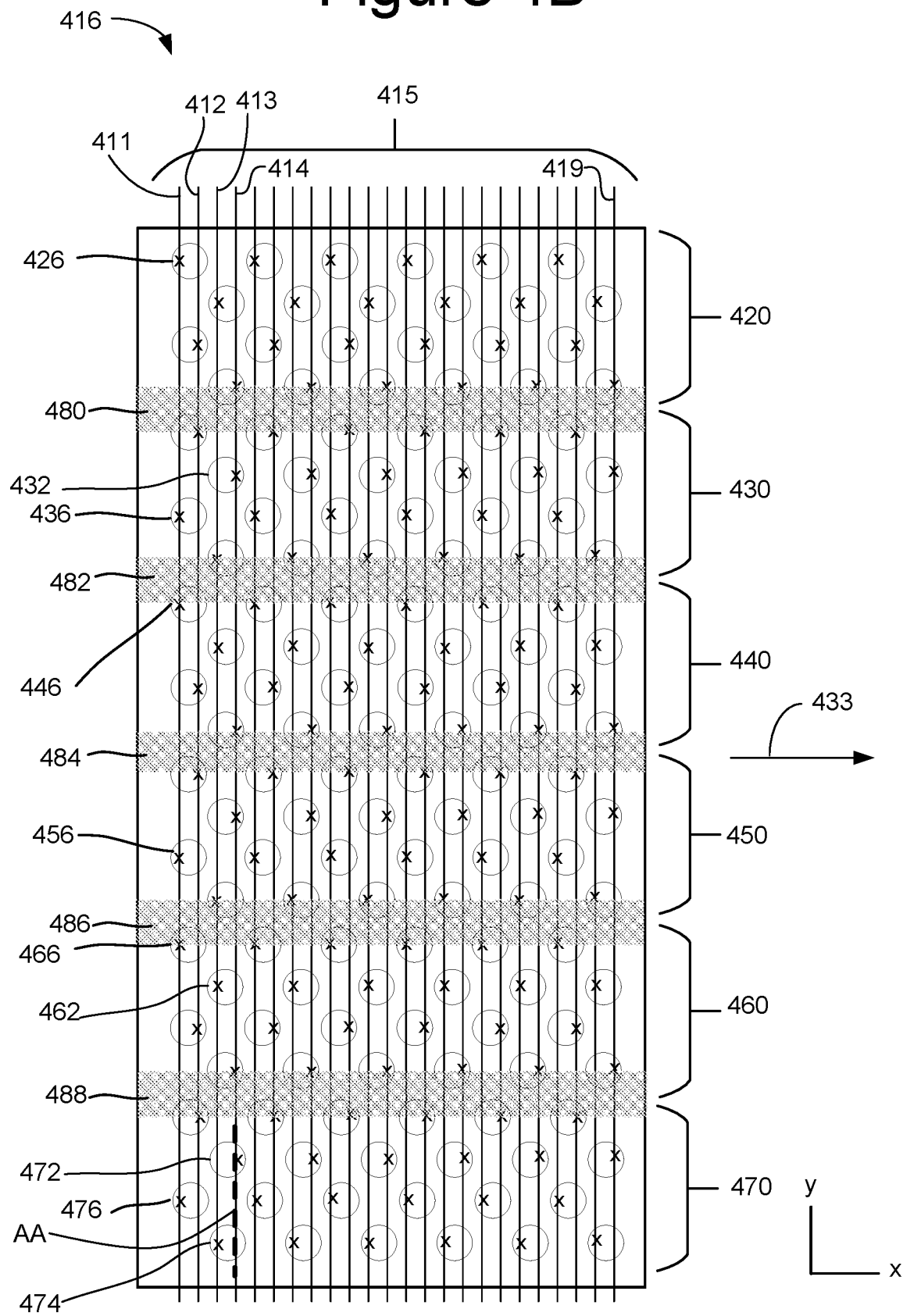
FIG. 4B is a block diagram depicting a top view of a portion of block of memory cells.
Figure 4D:
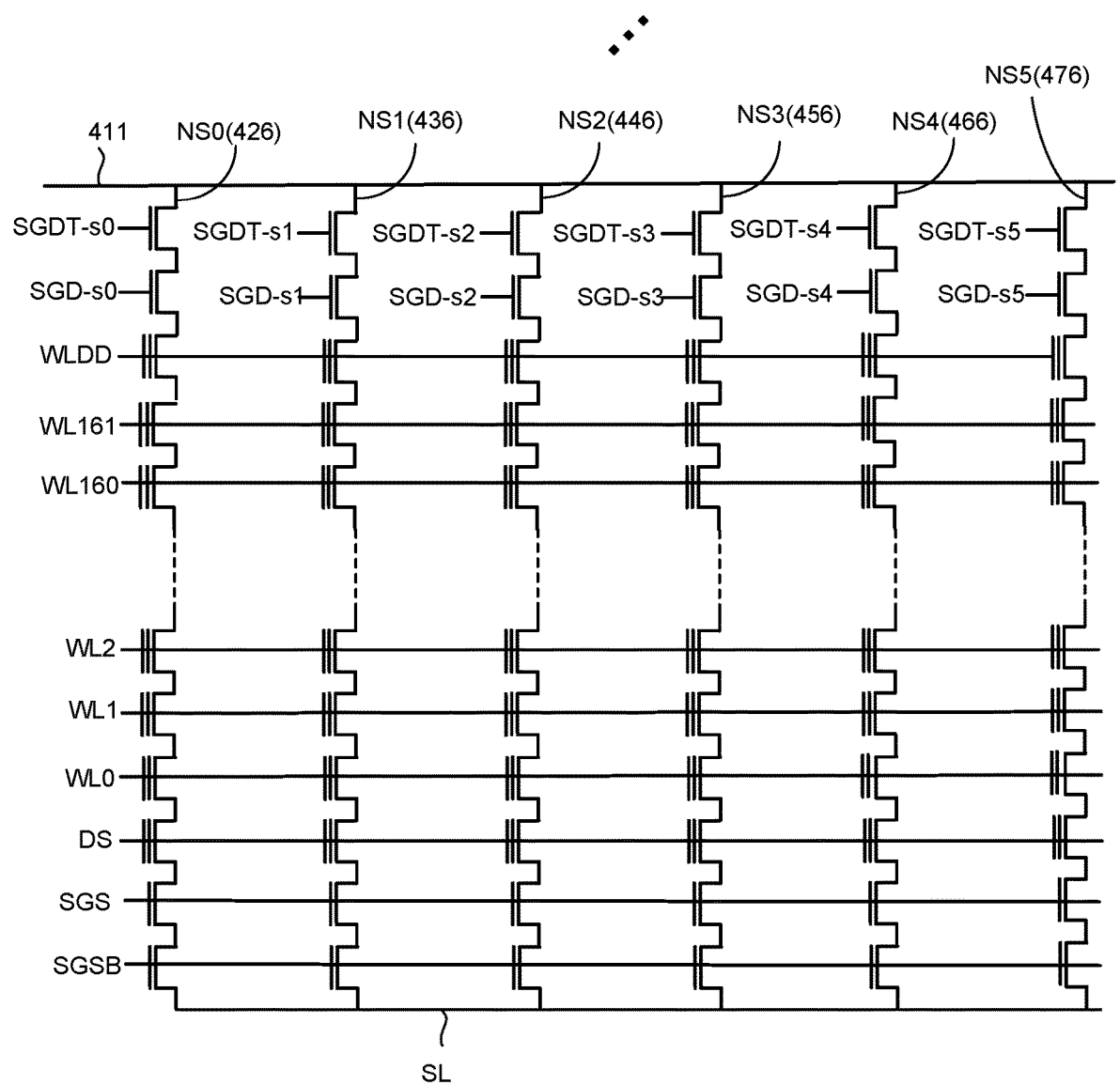
FIG. 4D is a schematic diagram of a portion of one embodiment of a block, depicting several NAND strings.

FIGS. 4B-4D depict an example three dimensional ("3D") NAND structure that corresponds to the structure of FIG. 4 and can be used to implement memory structure 202 of FIGS. 2A and 2B. FIG. 4B is a block diagram depicting a top view of a portion 416 of Block 1 of Plane 1 402-1. As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. Each of the vertical columns also includes one or more dummy select transistors. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of $SiO_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line only connects to one vertical column/NAND string in each of regions (sub-blocks) 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or fewer regions per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

FIG. 4B shows that the isolation regions 480, 482, 484, 486, 488 each cut into a portion of some of the memory holes. For example, isolation region 482 cuts into a portion of memory hole 446. Recall that the isolation region only goes down as far as the SGD layer. Select transistors are formed in the SGD layer.

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). Vertical columns 472 and 474 are depicted protruding through the dummy drain side select layers, drain side select layers, dummy source side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 472 has a source end at a bottom of the stack and a drain end at a top of the stack. As in agreement with FIG. 4B, FIG. 4C show vertical column 472 connected to bit line 414 via connector 417.

For ease of reference, dummy drain side select layers, drain side select layers; dummy source side select layers, source side select layers, dummy word line layers, and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL176. For example, dielectric layers DL166 is above word line layer WL159 and below word line layer WL160. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W161 connect to memory cells (also called data memory cells). Dummy word line layers DD0, DD1 and DS connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0, SGD1, and SGD2 are used to electrically connect and disconnect (or cut off) the channels of respective NAND strings from bit lines. Source side select layers SGS0, SGS1, and SGS2 are used to electrically connect and disconnect (or cut off) the channels of respective NAND strings from the source line SL. The stack in FIG. 4C is depicted as comprising one tier but can optionally include two or more tiers of alternating conductive and dielectric layers.

FIG. 4D is a schematic diagram of a portion of one embodiment of a block, depicting several NAND strings. FIG. 4D shows physical data word lines WL0-WL161 running across the entire block. The structure of FIG. 4D corresponds to a portion 416 in Block 1, Plane 1 of FIG. 4A, including bit line 411. Within the block, in one embodiment, each bit line is connected to six NAND strings. Thus, FIG. 4C shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each sub-block separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4D as SGS. Although the select gates SGD-s0, SGD-s1, SGD-s2, SGD-s3, SGD-s4, and SGD-s5 are isolated from each other due to the isolation regions, the data word lines WL0-WL161 of each sub-block are connected together.

In one embodiment, SGDT0 and SGDT1 are connected together to operate as a single logical dummy select gate for each sub-block separated by isolation regions (480, 482, 484, 486 and 486) to form SGDT-s0, SGDT-s1, SGDT-s2, SGDT-s3, SGDT-s4, and SGDT-s5. SGSB0 and SGSB1 are also connected together to operate as a single logical dummy select gate that is represented in FIG. 4D as SGSB.

The isolation regions (480, 482, 484, 486 and 486) are used to allow for separate control of sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5.

FIG. 4D only shows the NAND strings connected to bit line 411. However, a full schematic of the block would show every bit line and six vertical NAND strings connected to each bit line.

Although the example memories of FIGS. 4-4C are three dimensional memory structure that includes vertical NAND strings with charge-trapping material, other (2D and 3D) memory structures can also be used with the technology described herein.

Figure 5A:
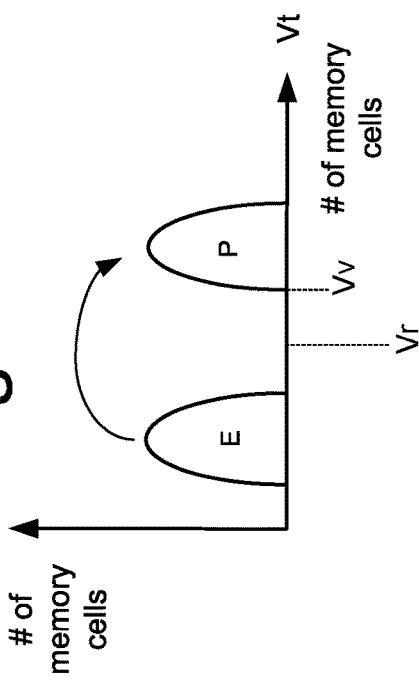
FIGS. 5A and 5B depicts threshold voltage distributions.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

Figure 5B:
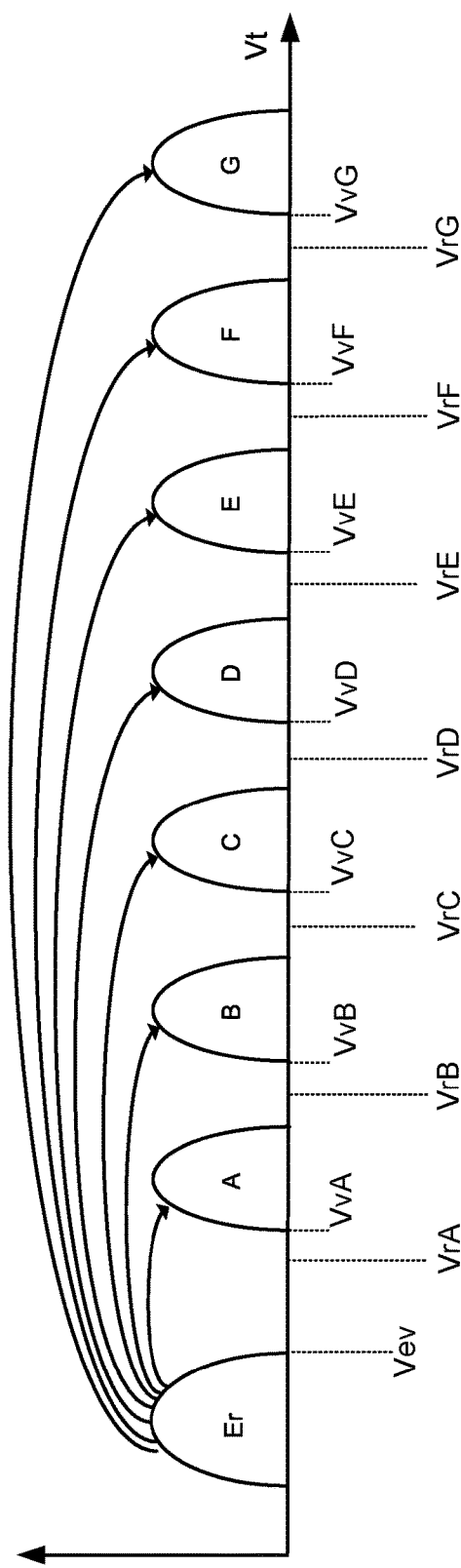

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify high voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

Figure 6:
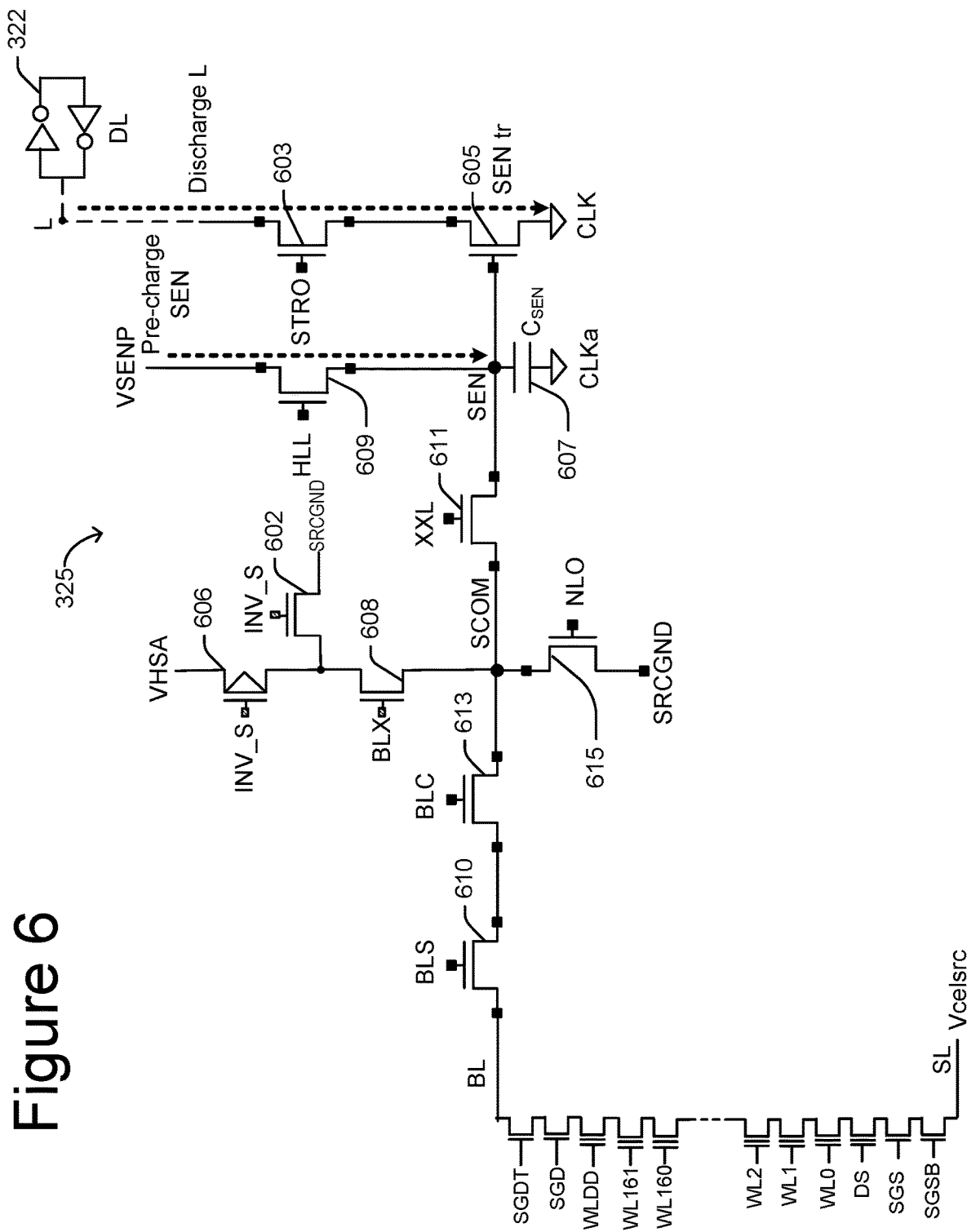
FIG. 6 is a schematic diagram of one embodiment of a sense amplifier.

FIG. 6 is a schematic diagram of one embodiment of a sense amplifier 325. First, basic operation of the sense amplifier 325 when sensing a memory cell will be discussed. The voltage level on the SEN node is set by pre-charging SEN to VSENP through HLL transistor 609, after which it is connected to a selected bit line by way of the transistor XXL 611, transistor BLC 613, and transistor BLS 610. The SCOM node between XXL 611 and BLC 613 can be set to a value, such as ground or pre-charged to a higher level, by way of transistor NLO 615 when XXL 611 and BLC 613 are off. The current of the bit line will depend on whether the memory cell's Vt is above or below the reference voltage applied to the memory cell. The bit line current may discharge SEN. Thus, if the memory cell is conductive, then SEN is discharged. If the memory cell is not conductive, then SEN is not discharged.

The sense transistor (SEN tr) 605 is used to test the magnitude of the voltage on SEN. Specifically, a strobe transistor 603 is turned on by STRO to test the magnitude of the voltage on SEN. The latch 322 represents the sense node latch 322 (see FIG. 3). The value of the latch 322 is determined by the voltage level on the node L, where the node L may be pre-charged to the high VSENP level and then, depending on the voltage level on the SEN node, either discharged or not through the transistor SEN tr 605 to the node CLK during a strobe operation when the transistor STRO 603 is turned on. As noted, the voltage level on the SEN node is pre-charged to VSENP through HLL transistor 609, after which it is connected to a selected bit line.

To hold charge on the SEN node, a sensing capacitor $C_{sen}$ 607 is connected to the SEN node, with its lower plate connect to the level CLKa. As illustrated by the broken line arrows, the upper plate of $C_{sen}$ 607 can be pre-charged by way of the pre-charge transistor HLL transistor 609, and then discharged to a selected memory cell along a corresponding bit line by an amount depending on how much current passes through the selected memory cell to set a voltage level on SEN. The level on SEN will then control the amount of current discharged from the node L, and the state latched in DL 322, by way of the sensing transistor SEN tr 605.

FIG. 6 also depicts transistors that may be used to charge the bit line. There are two charging paths for charging the bit line. A first path allows the bit line to be charged to VHSA by a path through transistor 606, BLX transistor 608, BLC transistor 613, and BLS transistor 608. A second path allows the bit line to be charged to SRCGND by a path through transistor 602, BLX transistor 608, BLC transistor 613, and BLS transistor 608. In some embodiments, the bit line is charged to either VHSA or SRCGND during programming. Based on voltages at the control gate and drain of the BLC transistor 613, the transistor can operate as a pass gate or as a bit line clamp. When the voltage at the control gate is sufficiently higher than the voltage on the drain, BLC transistor 613 operates as a pass gate. For example, a program-inhibit voltage such as 2.2 V (e.g., VHSA)) may be passed to the bit line when pre-charging and inhibiting an unselected NAND string. Or, a program-enable voltage such as 0V (e.g., SRCGND) may be passed to the bit line to allow programming in a selected NAND string.

During sensing the BLC transistor 613 may be operated as a source follower to clamp the bit line at a sensing voltage. One condition to operate as a source-follower is for the voltage at the control gate of transistor 613 to be lower than the voltage on the drain. When acting as a source-follower the bit line voltage is set or clamped at Vblc–Vth, where Vblc is the voltage on the control gate and Vth, e.g., 0.7 V, is the threshold voltage of the transistor 613. This assumes the source line (see SL in FIG. 4D) is at 0 V. The source line voltage is referred to herein as Vcelsrc. If Vcelsrc is non-zero, the bit line voltage is clamped at Vblc–Vcelsrc–Vth. The transistor 613 is therefore sometimes referred to as a bit line clamp (BLC) transistor, and the voltage Vblc on the control gate may be referred to as a bit line clamp voltage. The source-follower mode can be used during sensing operations such as read and verify operations. To provide Vsense, e.g., 0.8 V, on the bit line, the control gate of BLC transistor 613 may be set to Vsense+Vth, e.g., 1.5 V.

FIG. 7 depicts timing signals in sense amplifier 325 of FIG. 6 in connection with an embodiment of sensing a memory cell. As noted above, prior to sensing the memory cell the sense node SEN may be charge to a sense voltage. Between t1 and t2, HLL is raised high to pre-charge the sense node SEN. As a result, the voltage at SEN is charged to the pre-charge voltage Vpre. Note that Vpre is not required to be Vdd, as the time for which HLL is high can be adjusted to establish a suitable Vpre. At time t2, HLL goes low, which turns off transistor 609 to stop the pre-charging.

At time t3 the clock signal CLKa is raised. This has the effect of raising the voltage at SEN by a similar amount. Referring to FIG. 6, raising CLKa at the bottom plate of capacitor 607 has the effect of raising the top plate of the capacitor 607 (or sense node SEN) by a similar amount. Thus, after time t3, a sensing voltage has been established on the SEN node. Also, the word line voltage (not depicted in FIG. 7) has been established at a target reference level. Also, the source line voltage (not depicted in FIG. 7) has been provided to the source line. Also, the bit line voltage (not depicted in FIG. 7) has been clamped by BLC transistor 613 to a target voltage.

Referring to FIG. 7, at t4, the signal XXL goes high. Also note that BLS and BLC may be high at this time. Referring now to FIG. 6, XXL is provided to the gate of transistor 611, thus turning on transistor 611. Also, transistors 610 and 613 are on at this time. This connects the sense node SEN to the bit line. The capacitor 607 is allowed to discharge its charge through the bit line and NAND string (including the selected memory cell being sensed). The managing circuit will wait for a sensing time (tsense). In some embodiments, the sensing time (tsense) is adjusted to compensate for differences in IR drops between a voltage driver 406 and a control line 404. Referring to FIG. 7, the signal XXL remains high from t4 to t5. Also referring to FIG. 7, between t4 and t5, the sense node SEN discharges. Two different discharge rates are depicted. Curve 702 is associated with a memory cell having a low conduction current, and curve 704 is associated with a memory cell having a high conduction current. Stated another way, curve 702 is associated with a memory cell having a threshold voltage above the reference level. Curve 704 is associated with a memory cell having a threshold voltage below the reference level. Referring to FIG. 7, at t6 the clock signal CLKa is lowered. This has the effect of lowering the voltage at SEN by a similar amount.

Next, the voltage on the capacitor 607 is tested. The managing circuit will calculate the change in voltage across the capacitor 607 from the pre-charge voltage to the voltage after t6 (after the CLKa was lowered). Referring to FIG. 7, at t7, the strobe signal STRO goes high. Referring to FIG. 6, the sense transistor 605 will be either on or off in response to the voltage on the sense node SEN. With the strobe signal STRO high, transistor 603 is on, which provides a current path between the sense transistor 605 and the latch circuit 322. The latch circuit 322 will be set based on whether the sense transistor 605 conducts.

FIG. 8 is a flowchart of one embodiment of a process 800 of sensing memory cells while compensating for IR drop differences. Process 800 may be performed by a combination of memory controller 120, system control logic 260, and/or row control circuitry 220, which as noted above may be referred to as one or more control circuits. Process 800 may be used when sensing memory cells on NAND strings, which may reside in a 3D memory structure. Each NAND string may be associated with one or more control lines, including but not limited to, a source line, word lines, select lines.

Step 802 includes providing a voltage from a voltage driver 406 over a first electrical pathway 410 to a first control line 404 in a first block in a first plane 402 and over a second electrical pathway to a second control line 404 in a second block in a second plane 402. As one example, with reference to FIG. 4A, a voltage is provided from voltage driver 406a over electrical pathway 410a to the control line 404 in Block 1 in Plane 0 402-0 and over electrical pathway 410a to the control line 404 in Block 1 in Plane 1 402-1. In one embodiment, the control line 404 in each block is a source line that is connected to an end of a group of NAND strings in the block. The first electrical pathway 410a is the portion of the pathway between the voltage driver and the conductive line in Block 1 in Plane 0 402-0. The second electrical pathway 410a is the portion of the pathway between the voltage driver and the conductive line in Block 1 in Plane 1 402-1. The second electrical pathway 410a will have a greater total resistance than the first electrical pathway 410a. Therefore, there will be a greater IR drop over the second electrical pathway 410a. In one embodiment, the voltage driver and the one or more control circuits reside on a control die 211 and the first plane and the second plane reside on a memory structure die 201. In one embodiment, the voltage driver, the one or more control circuits reside, the first plane, and the second plane reside on the same semiconductor die 200.

Step 804 includes sensing memory cells in first and second blocks in parallel while compensating for a difference in a first resistance along the first electrical pathway between the voltage driver and the first control line a second resistance along the second electrical pathway between the voltage driver and the second control line. Stated another way, the difference in IR drop between the first and second electrical pathways is compensated for in step 804. In one embodiment, the memory cells in the second block are sensed for a longer time than those in the first block to compensate for a higher resistance of the second electrical pathway than the first electrical pathway. The higher resistance may result in a greater source line voltage, which may result in a lower memory cell current. The longer sense time compensates for the lower memory cell current. In one embodiment, sense nodes in sense amplifiers that sense memory cells in the second plane are discharged for a longer time than sense nodes in sense amplifiers that sense memory cells in the first plane to compensate for a higher resistance of the second electrical pathway than the first electrical pathway.

FIG. 9 is a flowchart of one embodiment of a process 900 of sensing memory cells while compensating for IR differences between a voltage driver and source lines in different blocks. Process 900 may be performed by a combination of memory controller 120, system control logic 260, and/or row control circuitry 220, which as noted above may be referred to as one or more control circuits. Process 900 may be used when sensing memory cells on NAND strings, which may reside in a 3D memory structure.

Step 902 includes providing a voltage from the voltage driver 406 along an electrical pathway 410 to a source line in a block that is selected for a sensing operation. Step 904 includes sense memory cells in the selected block during the sensing operation for a length of time that depends on a resistance along the electrical pathway 410 from the voltage driver 406 to the source line in the selected block. For example, with reference to FIG. 4A, the difference in resistance along the electrical pathway 410a from the voltage driver 406a to the various blocks in Plane 0 402-0 may be compensated for. As a specific example, a shorter sensing time can be used for Block 0, Plane 0, than for Block M-1, Plane 0. Therefore, process 900 may compensate for differences in IR drop along the electrical pathway 410 within the Plane. Process 900 may also compensate for differences in IR drop along the electrical pathway 410 from a block in one plane to a block on another plane. As a specific example, a shorter sensing time can be used for Block 0, Plane 0, than for Block 0, Plane 1.

Figure 10:
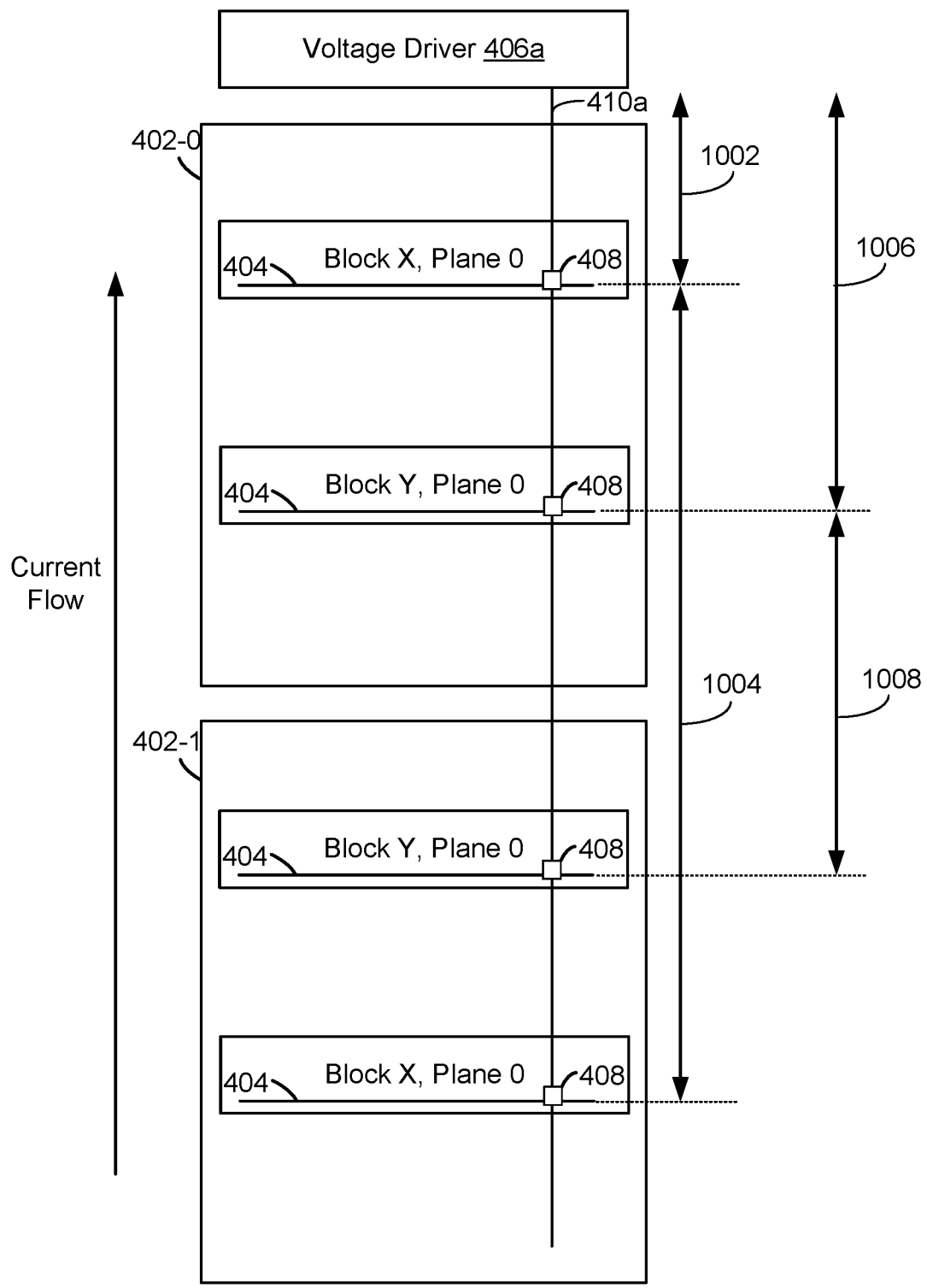
FIG. 10 is diagram that depicts further details of different IR drops to blocks of memory cells.

FIG. 10 is diagram that depicts further details of different IR drops to blocks of memory cells. Plane 0 402-0 and Plane 1 402-1 from FIG. 4A are depicted. However, the blocks are labeled differently for purpose of discussion. Double-headed arrow 1002 represents the distance along the electrical pathway 410a between the voltage driver 406a to control line 404 in Block X, Plane 0. The portion of the electrical pathway 410a that corresponds to double-headed arrow 1002 may be referred to as a first electrical pathway. Double-headed arrow 1004 represents the distance along the electrical pathway 410a between the control line 404 in Block X, Plane 0 and control line 404 in Block X, Plane 1. The portion of the electrical pathway 410a that corresponds to both double-headed arrows 1002 and 1004 be referred to as a second electrical pathway. Double-headed arrow 1006 represents the distance along the electrical pathway 410a between the voltage driver 406a to control line 404 in Block Y, Plane 0. Double-headed arrow 1008 represents the distance along the electrical pathway 410a between the control line 404 in Block Y Plane 0 and control line 404 in Block Y, Plane 1. The resistance along the electrical pathway 410a is related to the distance along the electrical pathway 410a. Hence, for purpose of discussion the relative distances will be discussed. However, the discussion could alternatively compare the relative resistances from the respective conductive lines 404 to the voltage driver 406. A direction of current flow is depicted. The current flows towards the voltage driver 406a in this example. However, the current could flow in the opposite direction.

Figure 11:
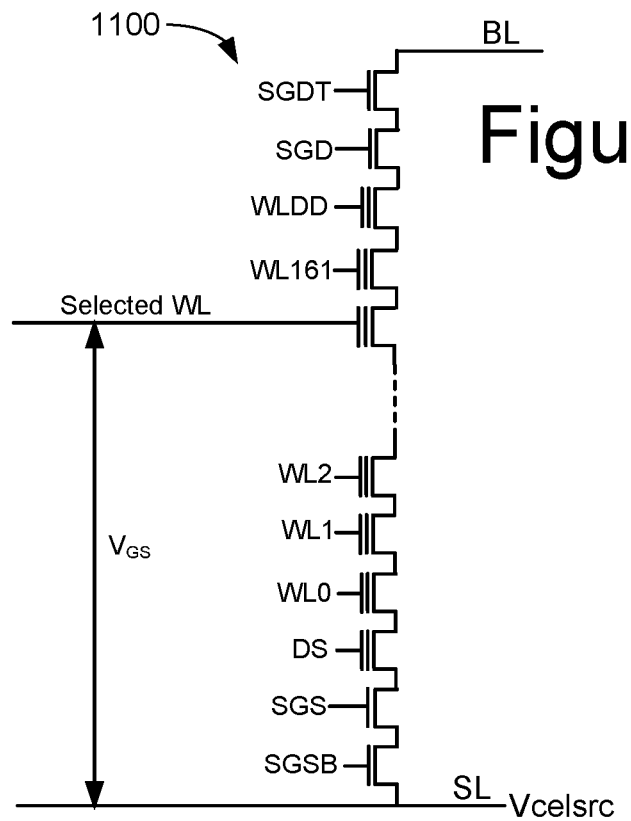
FIG. 11 depicts an example NAND string that is connected between a bit line (BL) and a source line (SL).

FIG. 11 depicts an example NAND string 1100 that is connected between a bit line (BL) and a source line (SL). FIG. 11 will be discussed with reference to FIG. 10. The NAND string 1100 could be in any of the blocks in FIG. 10. The magnitude of the voltage applied to the source line (SL) may depend on the distance between the block to the voltage driver 406. The magnitude of the voltage applied to the source line (SL) may depend on the resistance of the electrical pathway 410 between the block to the voltage driver 406. In an embodiment in which the current flows towards the voltage driver (see FIG. 10) the SL voltage will be higher the further that the block is from the voltage driver. When sensing the memory cell a reference voltage is applied to a selected memory cell. For example, with reference to FIG. 5B during a read one of VrA-VrG may be applied to the selected memory cell. In one embodiment, the reference voltage is applied by suitable choice of a voltage to the selected word line and a voltage to the source line. During a verify one of VvA-VvG may be applied to the selected memory cell. The voltage Vgs in FIG. 11 is the voltage between the selected word line and the source line. If the source line voltage is higher than a target voltage then Vgs may be below a target Vgs. In one embodiment, the sensing time is increased to account for the lower Vgs that results from the higher source line voltage.

Figure 12:
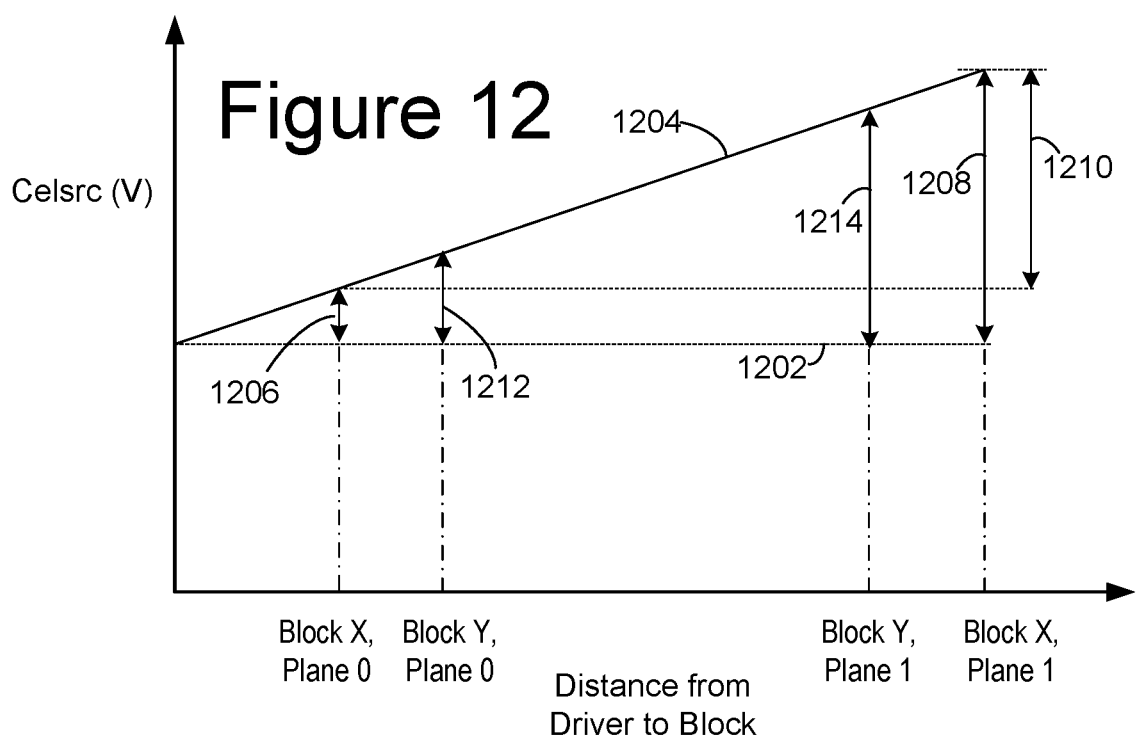
FIG. 12 is a graph that depicts source line voltage versus distance between the voltage driver and the block.

FIG. 12 is a graph that depicts source line voltage versus distance between the voltage driver and the block. As noted herein, there is a correlation between the distance and the resistance along the electrical pathway 410. FIG. 12 will be discussed with reference to FIGS. 9 and 10. In particular, the control lines 404 are source lines in this example. Dashed line 1202 indicates the magnitude of the voltage at the voltage driver 406 ("driver voltage"). Plot 1204 indicates the magnitude of the voltage along the electrical pathway 410 as a function of distance from the voltage driver 406. Plot 1204 may also be understood to correlate to the cumulative resistance along the electrical pathway 410 moving away from the voltage driver 406. Plot 1204 indicates that the voltage increases with further distance from the voltage driver 406, as has been discussed in connection with the example in which the current flows towards the voltage driver (see FIG. 12). In an alternative example the current flows away from the voltage driver 406 and the voltage decreases with further distance from the voltage driver 406.

Double-sided arrow 1206 shows the voltage difference between the driver voltage 1202 and the voltage at the control line 404 in Block X, Plane 0. Double-sided arrow 1208 shows the voltage difference between the driver voltage 1202 and the voltage at the control line 404 in Block X, Plane 1. Double-sided arrow 1210 shows the voltage difference between the voltage at the control line 404 in Block X, Plane 0 and the voltage at the control line 404 in Block X, Plane 1. Double-sided arrow 1212 shows the voltage difference between the driver voltage 1202 and the voltage at the control line 404 in Block Y, Plane 0. Double-sided arrow 1214 shows the voltage difference between the driver voltage 1202 and the voltage at the control line 404 in Block Y, Plane 1. Each of these voltage differences may also be referred to as IR drops.

In an embodiment, an offset is added to the sensing time based on the IR drop from the voltage driver 406 to the control line 404 in the selected block. In one embodiment, a group of memory cells in Plane 0 402-0 are sensed in parallel with a group of memory cells in Plane 1 402-1. In one embodiment, a first offset compensates for the IR drop to the selected block in Plane 0 402-0 and a second offset accounts for the IR drop between the selected block in Plane 0 402-0 and the selected block in Plane 1 402-1. As an example, the first offset may compensate for IR drop 1206 and the second offset may compensate for IR drop 1210. Also, the first and second offsets may be added together when sensing the selected block in Plane 1 402-1. Alternatively, a single offset to account for IR drop 1214 may be used when sensing in the second Plane 1 402-1.

Figure 13A:
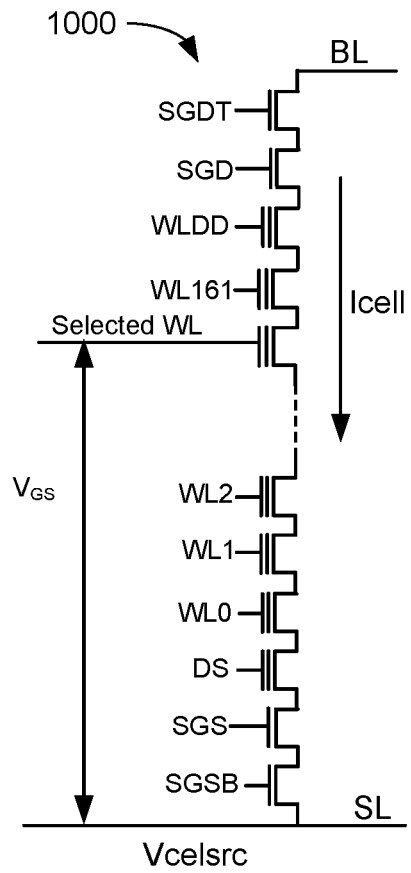
FIG. 13A depicts NAND string for an example with no IR drop.
Figure 13B:
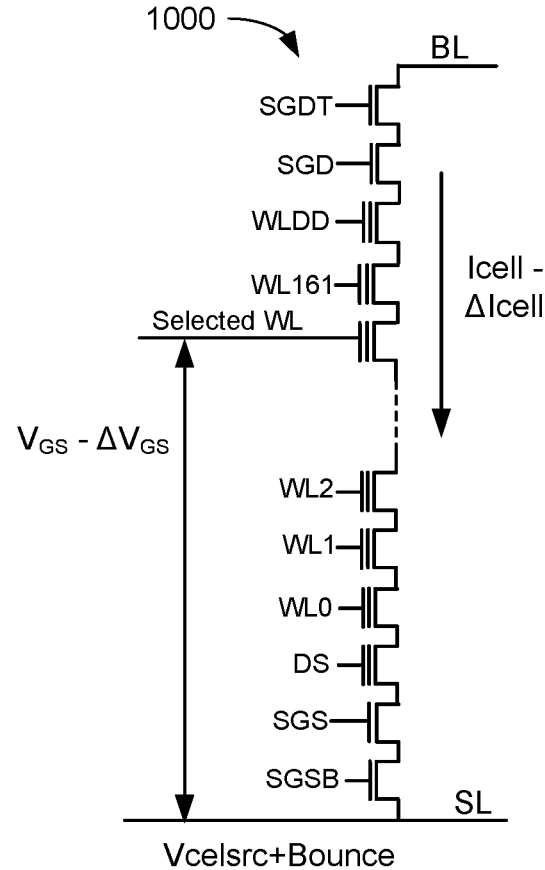
FIG. 13B depicts NAND string for an example with an IR drop.
Figure 14:
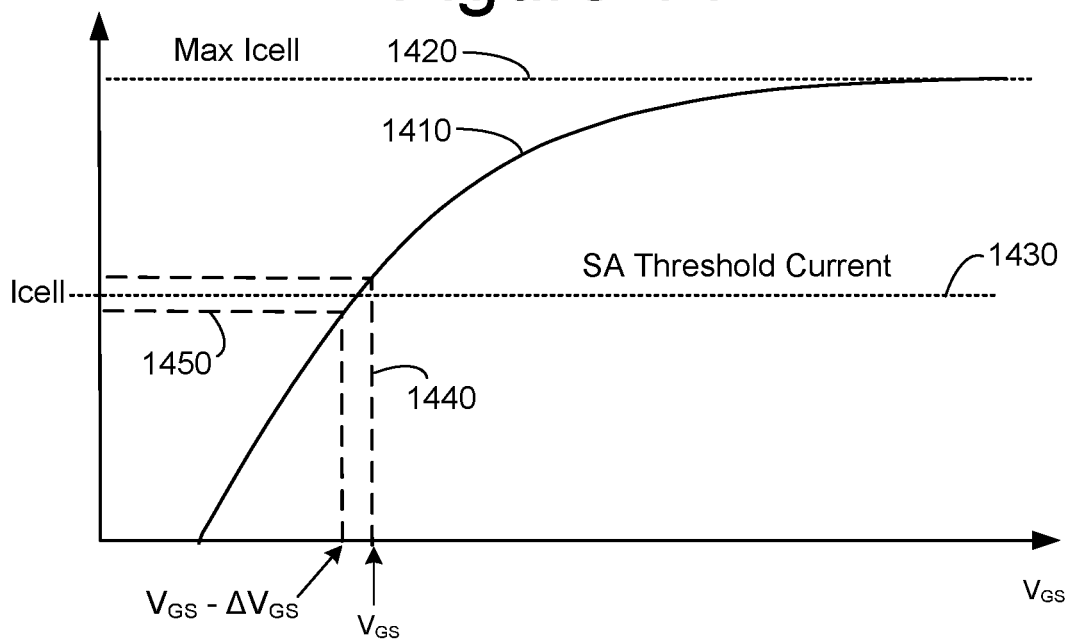
FIG. 14 is a graph that depicts memory cell current (Icell) versus Vgs.

FIGS. 13A, 13B, and 14 depict further details of how modifying the sensing time compensates for differences in IR drops. FIG. 13A depicts NAND string 1000 for an example with no IR drop. The source line (SL) is biased on Vcelsrc. The selected word line is biased based a reference voltage, which result in Vgs between the selected word line and the source line. The current that flows in the selected memory cell is Icell. FIG. 13B depicts NAND string 1000 for an example with an IR drop that results in the source line (SL) being biased to Vcelsrc+Bounce. The selected word line is biased as in FIG. 13B, but the selected word line to source line voltage is Vgs−ΔVgs. The current that flows in the selected memory cell is Icell−ΔIcell. Thus, the memory cell current in FIG. 13B will be lower than the example of FIG. 13A. The lower memory cell current in FIG. 13B may be compensated for by increasing the sensing time in order to compensate for the IR drop.

FIG. 14 is a graph that depicts memory cell current (Icell) versus Vgs. Plot 1410 represents Icell versus Vgs. Dashed line 1420 is the maximum Icell. Dashed line 1430 is the base threshold current that is used as a trip point in the sense amplifier (SA). The threshold current may also be referred to as a demarcation current. The demarcation current is used to determine whether the memory cell's Vt is above the reference voltage. Referring back to FIG. 5B, if the memory cell's Vt is above the reference voltage (e.g., VvB) then the memory cell will turn on and conduct a significant current. The SA is designed to test for this current. Hence, if the memory cell's Vt is above the reference voltage, then Icell will be above the demarcation current. If the memory cell's Vt is below the reference voltage, then Icell will be below the demarcation current.

FIG. 14 depicts shows a dashed line 1440 that represents the no IR drop example of FIG. 13A, as well as dashed line 1450 that represents the IR drop example of FIG. 13B. For the no IR drop example, dashed line 1440 indicates that the full Vgs results in an Icell that is greater than the SA threshold current 1430. Therefore, the memory cell will be correctly sensed. For the IR drop example, dashed line 1450 indicates that the lower Vgs−ΔVgs results in an Icell (see Icell−ΔIcell in FIG. 13B) that is less than the SA threshold current 1430. Therefore, the memory cell could be misread if no IR compensation were used. However, using a longer sensing time, in an embodiment, lowers the effective SA threshold current 1430, which compensates for the IR drop. Therefore, the state of the memory cell will be correctly sensed even with the IR drop.

Figure 15:
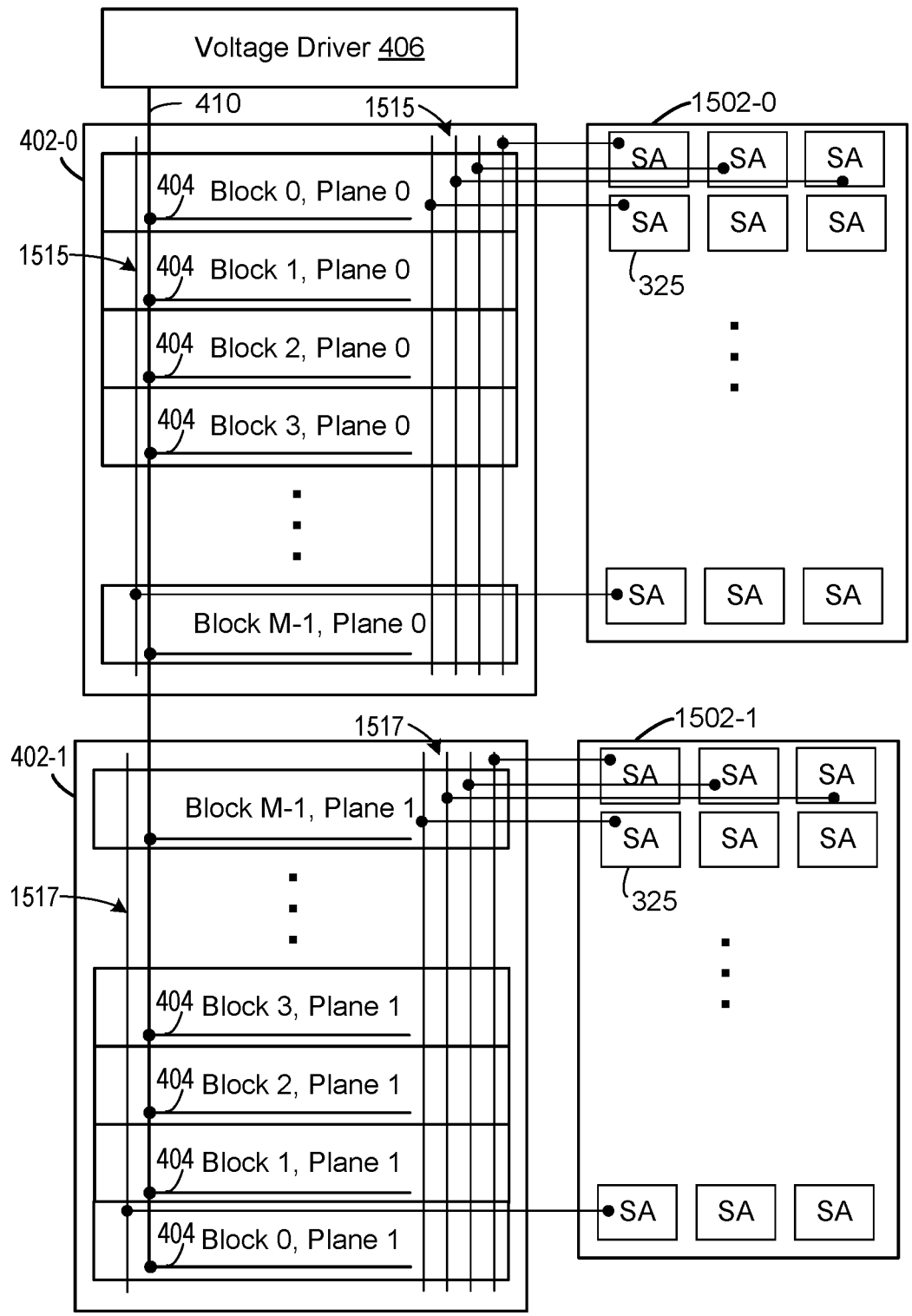
FIG. 15 depicts one embodiment of an organization of sense amplifiers and planes.

FIG. 15 depicts one embodiment of an organization of sense amplifiers and planes. Two planes 402-0 and 402-1 are depicted, along with a voltage driver 406. The voltage driver 406 is able to provide a voltage to a control line 404 in a selected block in Plane 0 402-0 and a control line 404 in a selected block in Plane 1 402-1, as has been previously discussed. In an embodiment, there is a group 1502-0 of sense amplifiers (SA) 325 associated with Plane 0 402-0 and a group 1502-1 of sense amplifiers (SA) 325 associated with Plane 1 402-1. In one embodiment, the sense amplifiers (SA) 1502 reside on the memory die 200 (see FIG. 2A). In one embodiment, the sense amplifiers (SA) 1502 reside on the control die 211 (see FIG. 2B).

A first group of bit lines 1515 are depicted in Plane 0 402-0. A second group of bit lines 1517 are depicted in Plane 1 402-1. There may be thousands of bit lines for each plane 402. Only a few of the many bit lines are depicted. In an embodiment, each bit line may be selectively connected to a NAND string in one block in a given plane at a time. For example, when Block 2, Plane 0 is selected for sensing, the SGD transistors on the NAND strings in Block 2, Plane 0 may be turned on to connect those NAND strings to the bit lines. When sensing Block 3, Plane 0 is selected for sensing, the SGD transistors on the NAND strings in Block 3, Plane 0 may be turned on to connect those NAND strings to the bit lines, etc.

In an embodiment, each bit line 1515 of the Plane 0 402-0 is associated with a sense amplifier 325 in the first group 1502-0 and each bit line 1517 of the Plane 1 402-1 is associated with a sense amplifier 325 in the second group 1502-1. In an embodiment, the sense amplifiers 325 in the first group 1502-0 are operated to sense a group of memory cells in a selected block in Plane 0 402-0 in parallel with operating the sense amplifiers 325 in the second group 1502-1 to sense a group of memory cells in a selected block in Plane 1 402-1. In one embodiment, when sensing a selected block in one of the planes, the same sensing time can be used for all of the sense amplifiers 325. However, when sensing a block from each plane 402-0, 402-1 in parallel, a different sensing time can be used for the sense amplifiers 325 in the first group 1502-0 than the sense amplifiers 325 in the second group 1502-1. The different sensing time may be used to compensate for a difference in IR drop along the electrical pathway 410 between the selected block in Plane 0 402-0 and the selected block in Plane 1 402-1. In one embodiment, the sensing time that is used depends on the location of the block within a plane 402. For example, a longer sensing time may be used for a block such as Block M-1 in Plane 0 than for Block 2 in Plane 0 due to Block M-1 being further from the voltage driver 406 than Block 2.

Figure 16:
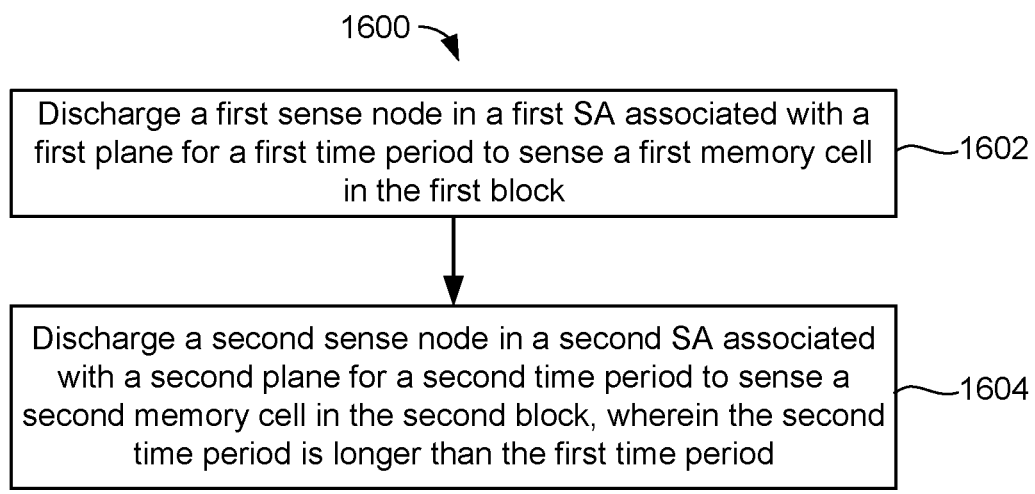
FIG. 16 is a flowchart of one embodiment of a process of sensing memory cells while compensating for different IR drops to blocks in different planes.

FIG. 16 is a flowchart of one embodiment of a process 1600 of sensing memory cells while compensating for different IR drops to blocks in different planes. In one embodiment, one block in Plane 0 402-0 and one block in Plane 1 402-1 is selected for sensing. In one embodiment, process 1600 is used to compensate for different IR drops between a voltage driver 406 and a source line in the selected block in Plane 0 402-0 and a source line in the selected block in Plane 1 402-1. Process 1600 may be used in one embodiment of step 804 of process 800.

Step 1602 includes discharging a first sense node (e.g., SEN) in a first sense amplifier 325 associated with a first plane (e.g., Plane 0 402-0) for a first time period to sense a first memory cell in the first block. With reference to FIG. 7, in one embodiment, the length of tsense is the first time period.

Figure 17:
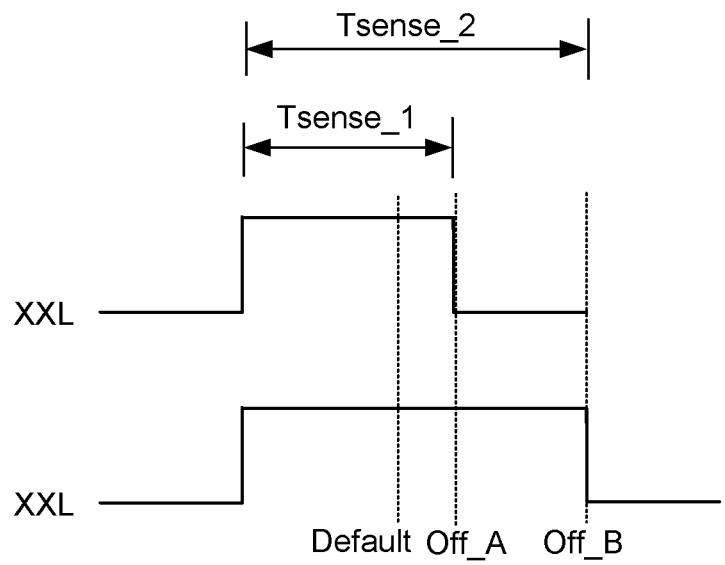
FIG. 17 shows how the XXL signal may be modified to provide the longer sensing time to compensate for the difference in IR drop between the blocks.

Step 1604 includes discharging a second sense node (e.g. SEN) in a second sense amplifier 325 associated with a second plane (e.g., Plane 1 402-1) for a second time period to sense a second memory cell in the second block, wherein the second time period is longer than the first time period. FIG. 17 shows how the XXL signal may be modified to provide the longer sensing time to compensate for the difference in IR drop between the two blocks. FIG. 17 shows that Tsense_1 for the first sense amplifier 325 in a first plane is shorter than Tsense_2 for the second sense amplifier 325 in a second plane. FIG. 17 depicts a dashed line that corresponds to a default sensing time, which does not provide any IR compensation. The dashed line labeled Off_A is a first offset that provides compensation for the IR drop between the voltage driver 406 and the selected block in Plane 0, 402-0. The dashed line labeled Off_B is a second offset. The second offset Off_B can be computed as an additional offset to Off_A, in which case Off_B compensates for the IR drop between the selected block in Plane 0 402-0 and the selected block in Plane 1 402-1. The second offset Off_B could alternatively be computed as the offset from the default, in which case Off_B compensates for the IR drop between the voltage driver 406 and the selected block in Plane 1 402-1.

Figure 18:
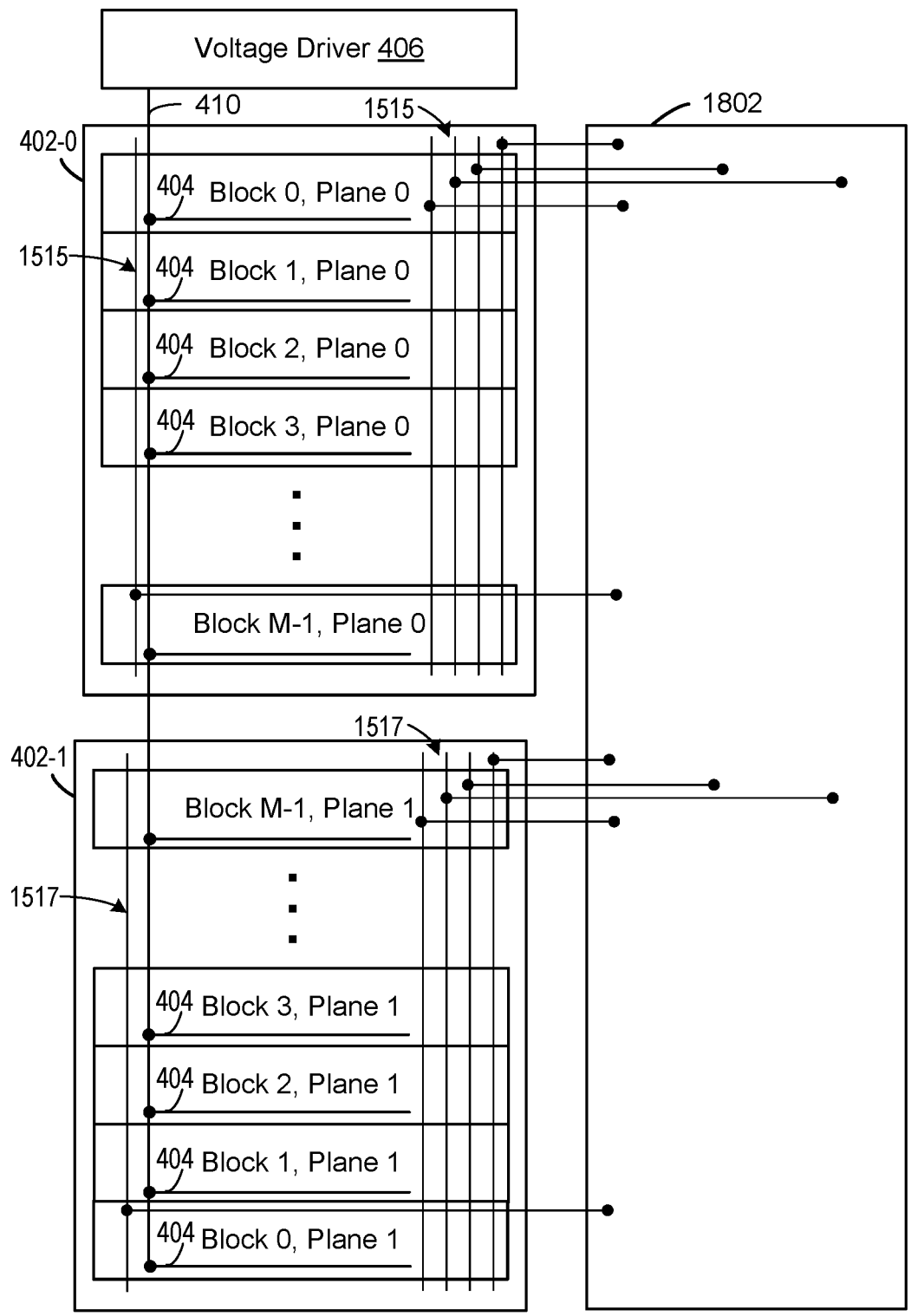
FIG. 18 depicts one embodiment of an organization of in which sense amplifiers are shared between planes.

In one embodiment, the sense amplifiers are shared between two planes 402. FIG. 18 depicts one embodiment of an organization of sense amplifiers and planes. Plane 0 402-0 and Plane 1 402-1 are similar to the example in FIG. 15. However, there is only one group of sense amplifiers 1802 in FIG. 18. In an embodiment, Plane 0 402-0 and Plane 1 402-1 are sensed sequentially, as opposed to the parallel sensing discussed in connection with FIG. 15. For example, in FIG. 18 there may be about 8K bit lines 1515 for Plane 0 402-0 and about 8K bit lines 1517 for Plane 1 402-1. There may be about 8K sense amplifiers 325 in the group 1802. Each sense amplifier 325 may be used to sense one of the bit lines 1515 in the Plane 0 402-0 at one point in time. At a later time, each sense amplifier 325 may be used to sense one of the bit lines 1517 in the Plane 1 402-1. Similar to the discussion in FIGS. 16 and 17, different sensing times may be used to compensate for different IR drops from the voltage driver 406 to the selected block.

In view of the foregoing, a first embodiment includes an apparatus, comprising a voltage driver and one or more control circuits in communication with the voltage driver. The one or more control circuits are configured to connect to a first plurality of contiguous blocks of memory cells and a second plurality of contiguous blocks of memory cells. Each block comprises memory cells and a control line connected to the memory cells. The one or more control circuits configured to provide a voltage from the voltage driver over a first electrical pathway to a first control line in a first block in the first plurality of contiguous blocks and over a second electrical pathway to a second control line in a second block in the second plurality of contiguous blocks during parallel sensing operations of first memory cells in the first block and second memory cells in the second block. The one or more control circuits configured to sense the first memory cells and the second memory cells during the parallel sensing operations while compensating for a difference between a first resistance along the first electrical pathway from the voltage driver to the first control line a second resistance along the second electrical pathway from the voltage driver to the second control line.

In a second embodiment, in furtherance to the first embodiment, the one or more control circuits are configured to increase a length of time that the second memory cells are sensed relative to a length of time that the first memory cells are sensed to compensate for the difference between the first resistance and the second resistance.

In a third embodiment, in furtherance to the first or second embodiments, the one or more control circuits are configured to connect a first group of sense amplifiers to the first group of memory cells. The first group of sense amplifiers each having a first sense node. The one or more control circuits are configured to connect a second group of sense amplifiers to the second memory cells. The second group of sense amplifiers each having a second sense node. The one or more control circuits are configured to discharge the first sense nodes for a shorter period of time than the second sense nodes to compensate for the difference between the first resistance and the second resistance.

In a fourth embodiment, in furtherance to any of the first to third embodiments, the respective blocks in the first plurality of contiguous blocks each comprise a plurality of NAND strings and a source line connected to an end of the NAND strings. The respective blocks in the second plurality of contiguous blocks each comprise a plurality of NAND strings and a source line connected to an end of the NAND strings. The first control line is a first source line in the first block. The second control line is a second source line in the second block.

In a fifth embodiment, in furtherance any of the fourth embodiment, the one or more control circuits are configured to provide a reference voltage to a first selected word line in the first block and to a second selected word line in the second block during the parallel sensing operations.

In a sixth embodiment, in furtherance to any of the first to fifth embodiments, the voltage driver and the one or more control circuits reside on a first semiconductor die. The first plurality of contiguous blocks and the second plurality of contiguous blocks reside on a second semiconductor die.

In a seventh embodiment, in furtherance to any of the first to fifth embodiments, the voltage driver and the one or more control circuits reside on a first semiconductor die. The first plurality of contiguous blocks and the second plurality of contiguous blocks reside on a second semiconductor die.

In an eighth embodiment, in furtherance to any of the first to seventh embodiments, the first electrical pathway and the second electrical pathway overlap between the voltage driver and the first control line in the first block.

In a ninth embodiment, in furtherance to the any of the first to eighth embodiments, the apparatus comprises a first plane having a first plurality of bit lines and the first plurality of contiguous blocks, a second plane having a second plurality of bit lines and the second plurality of contiguous blocks. The one or more control circuits is configured to compensate for a different IR drop of the first electrical pathway than the second electrical pathway.

In a tenth embodiment, in furtherance to any of the first to the ninth embodiments, the one or more control circuits are configured to add a first time offset to a default sensing time when sensing the memory cells in the first block to compensate for a first IR drop between the voltage driver over the first electrical pathway to the first control line in the first block. The one or more control circuits are configured to add a second time offset to the default sensing time when sensing the memory cells in the second block to compensate for a second IR drop between the voltage driver over the second electrical pathway to the second control line in the second block. The second IR drop is greater than the first IR drop. The second time offset is greater than the first time offset. A difference between the second time offset and the first time offset compensates for the difference between the first resistance and the second resistance.

In an eleventh embodiment, in furtherance to any of the first to ninth embodiments, the one or more control circuits are configured to add a first time offset to a default sensing time when sensing the memory cells in the first block to compensate for a first distance between the voltage driver over the first electrical pathway to the first control line in the first block. The one or more control circuits are configured to add a second time offset to the first time offset when sensing the memory cells in the second block to compensate for a second distance between the first control line in the first block over the second electrical pathway to the second control line in the second block. The second time offset compensates for the difference between the first resistance and the second resistance.

In a twelfth embodiment, in furtherance to the eleventh embodiment, the first time offset is an address dependent offset that depends on the address of the first block. The second time offset depends on a physical distance between the first block and the second block.

One embodiment includes a method for sensing memory cells. The method comprises providing a voltage from a voltage driver over a first electrical pathway to a first control line in a first block in a first plane of a memory structure while providing the voltage from the voltage driver over a second electrical pathway to a second control line in a second block in a second plane of the memory structure. The method comprises sensing a first group of memory cells in the first block and a second group of memory cells in the second block in parallel, including: discharging a first sense node in a first sense amplifier for a first time period to sense a first selected memory cell in the first block; and discharging a second sense node in a second sense amplifier for a second time period to sense a second selected memory cell in the second block. The second time period is longer than the first time period to compensate for a different voltage drop along the first electrical pathway between the first control line to the voltage driver and the second electrical pathway between the second control line to the voltage driver.

One embodiment includes a non-volatile storage system comprising a plurality of blocks of memory cells. Each block comprises a plurality of NAND strings and a source line connected to an end of each of the NAND strings. The storage system includes a voltage driver and an electrical pathway between the voltage driver and the source lines in respective blocks. A resistance of the electrical pathway between the voltage driver and respective source lines depends on a distance between the voltage driver and the respective blocks. The storage system includes one or more control circuits in communication with the voltage driver and the plurality of blocks. The one or more control circuits provide a voltage from the voltage driver along the electrical pathway to a source line in a block that is selected for a sensing operation. The one or more control circuits sense memory cells in the selected block during the sensing operation for a length of time that depends on a resistance along the electrical pathway from the voltage driver to the source line in the selected block. Different sensing times are used for different blocks to compensate for different distances between the blocks to the voltage driver.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a voltage driver; and
one or more control circuits in communication with the voltage driver, the one or more control circuits configured to connect to a first plurality of contiguous blocks of memory cells and a second plurality of contiguous blocks of memory cells, each block comprising memory cells and a control line connected to the memory cells, the one or more control circuits configured to:
provide a voltage from the voltage driver over a first electrical pathway to a first source line in a first block in the first plurality of contiguous blocks and over a second electrical pathway to a second source line in a second block in the second plurality of contiguous blocks during parallel sensing operations of a first memory cells in the first block and second memory cells in the second block; and sense the first memory cells and the second memory cells during the parallel sensing operations while compensating for a difference between a first resistance along the first electrical pathway from the voltage driver to the first source line a second resistance along the second electrical pathway from the voltage driver to the second source line, including increase a length of time that the second memory cells are sensed relative to a length of time that the first memory cells are sensed to compensate for the difference between the first resistance and the second resistance.

2. The apparatus of claim 1, wherein the one or more control circuits are configured to:
connect a first group of sense amplifiers to the first memory cells, the first group of sense amplifiers each having a first sense node;
connect a second group of sense amplifiers to the second memory cells, the second group of sense amplifiers each having a second sense node; and
discharge the first sense nodes for a shorter period of time than the second sense nodes to compensate for the difference between the first resistance and the second resistance.

3. The apparatus of claim 1, wherein:
the respective blocks in the first plurality of contiguous blocks each comprise a plurality of NAND strings and the first source line connected to an end of the NAND strings, the first plurality of contiguous blocks reside in a first plane; and
the respective blocks in the second plurality of contiguous blocks each comprise a plurality of NAND strings and the second source line connected to an end of the NAND strings, the second plurality of contiguous blocks reside in a second plane.

4. The apparatus of claim 3, wherein the one or more control circuits are further configured to:
provide a reference voltage to a first selected word line in the first block and to a second selected word line in the second block during the parallel sensing operations.

5. The apparatus of claim 1, wherein:
the voltage driver and the one or more control circuits reside on a first semiconductor die; and
the first plurality of contiguous blocks and the second plurality of contiguous blocks reside on a second semiconductor die.

6. The apparatus of claim 1, wherein the voltage driver, the one or more control circuits reside, the first plurality of contiguous blocks, and the second plurality of contiguous blocks reside on the same semiconductor die.

7. The apparatus of claim 1, wherein the first electrical pathway and the second electrical pathway overlap between the voltage driver and the first source line in the first block.

8. The apparatus of claim 1, wherein:
the apparatus comprises a first plane having a first plurality of bit lines and the first plurality of contiguous blocks, a second plane having a second plurality of bit lines and the second plurality of contiguous blocks; and
the one or more control circuits is configured to compensate for a different IR drop of the first electrical pathway than the second electrical pathway.

9. The apparatus of claim 1, wherein the one or more control circuits are configured to:
add a first time offset to a default sensing time when sensing the memory cells in the first block to compensate for a first IR drop between the voltage driver over the first electrical pathway to the first source line in the first block; and
add a second time offset to the default sensing time when sensing the memory cells in the second block to compensate for a second IR drop between the voltage driver over the second electrical pathway to the second source line in the second block, wherein the second IR drop is greater than the first IR drop, wherein the second time offset is greater than the first time offset, wherein a difference between the second time offset and the first time offset compensates for the difference between the first resistance and the second resistance.

10. The apparatus of claim 1, wherein the one or more control circuits are configured to:
add a first time offset to a default sensing time when sensing the memory cells in the first block to compensate for a first distance between the voltage driver over the first electrical pathway to the first source line in the first block; and
add a second time offset to the first time offset when sensing the memory cells in the second block to compensate for a second distance between the first source line in the first block over the second electrical pathway to the second source line in the second block, wherein the second time offset compensates for the difference between the first resistance and the second resistance.

11. The apparatus of claim 10, wherein:
the first time offset is an address dependent offset that depends on the address of the first block; and
the second time offset depends on a physical distance between the first block and the second block.

12. A method for sensing memory cells, the method comprising:
providing a voltage from a voltage driver over a first electrical pathway to a first source line in a first block in a first plane of a memory structure while providing the voltage from the voltage driver over a second electrical pathway to a second source line in a second block in a second plane of the memory structure; and
sensing a first group of memory cells in the first block and a second group of memory cells in the second block in parallel, including:
discharging a first sense node in a first sense amplifier for a first time period to sense a first selected memory cell in the first block; and
discharging a second sense node in a second sense amplifier for a second time period to sense a second selected memory cell in the second block, wherein the second time period is longer than the first time period to compensate for a different voltage drop along the first electrical pathway between the first source line to the voltage driver and the second electrical pathway between the second source line to the voltage driver.

13. A non-volatile storage system, the storage system comprising:
a plurality of blocks of memory cells, each block comprising a plurality of NAND strings and a source line connected to an end of each of the NAND strings;
a voltage driver;
an electrical pathway between the voltage driver and the source lines in respective blocks, wherein a resistance of the electrical pathway between the voltage driver and respective source lines depends on a distance between the voltage driver and the respective blocks; and one or more control circuits in communication with the voltage driver and the plurality of blocks, the one or more control circuits:

provide a voltage from the voltage driver along the electrical pathway to a source line in a block that is selected for a sensing operation; and sense memory cells in the selected block during the sensing operation for a length of time that depends on a resistance along the electrical pathway from the voltage driver to the source line in the selected block, wherein different sensing times are used for different blocks to compensate for different distances between the blocks to the voltage driver.

14. The non-volatile storage system of claim 13, wherein the one or more control circuits are configured to:

provide the voltage from the voltage driver along the electrical pathway to a first source line in a first block and to a second source line in a second block at the same time; and sense second memory cells in the second block for a longer time than first memory cells in the first block to compensate for a higher resistance along the electrical pathway from the voltage driver to the second source line than from the voltage driver to the first source line, wherein the first memory cells and the second memory cells are sensed in parallel.

15. The non-volatile storage system of claim 13, wherein the one or more control circuits are configured to:

provide the voltage from the voltage driver along the electrical pathway to a first source line in a first block at a first point in time;

provide the voltage from the voltage driver along the electrical pathway to a second source line in a second block at a later time; and sense second memory cells in the second block for a longer time than first memory cells in the first block to compensate for a higher resistance along the electrical pathway from the voltage driver to the second source line than from the voltage driver to the first source line, wherein the first memory cells and second memory cells are sensed sequentially.

16. The non-volatile storage system of claim 13, further comprising:

a plurality of sense amplifiers, each sense amplifier having a sense node, wherein the one or more control circuits are configured to discharge the sense node for the length of time that depends on the resistance along the electrical pathway from the voltage driver to the source line in the selected block to compensate for an IR drop between the voltage driver to the source line in the selected block.

17. The non-volatile storage system of claim 13, wherein: the plurality of blocks of memory cells are in the same plane of memory cells, wherein the plane comprises a plurality of bit lines.

18. The non-volatile storage system of claim 13, wherein: a first group of the plurality of blocks of memory cells reside in a first plane and a second group of the plurality of blocks of memory cells reside in a second plane; and the one or more control circuits are configured to sense first memory cells in a first block in the first plane and second memory cells in a second block in the second plane in parallel while compensating for a difference in a first resistance along the electrical pathway between the voltage driver and the source line in the first block and a second resistance along the electrical pathway between the voltage driver and the source line in the second block.

\* \* \* \* \*